United States Patent
Yamada et al.

(10) Patent No.: US 8,347,026 B2
(45) Date of Patent: Jan. 1, 2013

(54) MEMORY DEVICE AND MEMORY DEVICE CONTROL METHOD

(75) Inventors: Takashi Yamada, Hyogo (JP); Daisuke Imoto, Osaka (JP)

(73) Assignee: Panasonic Corporation, Osaka (JP)

( * ) Notice: Subject to any disclaimer, the term of this patent is extended or adjusted under 35 U.S.C. 154(b) by 336 days.

(21) Appl. No.: 12/808,868

(22) PCT Filed: Dec. 18, 2008

(86) PCT No.: PCT/JP2008/003832
§ 371 (c)(1),
(2), (4) Date: Jun. 17, 2010

(87) PCT Pub. No.: WO2009/081551
PCT Pub. Date: Jul. 2, 2009

(65) Prior Publication Data
US 2011/0167228 A1 Jul. 7, 2011

(30) Foreign Application Priority Data
Dec. 21, 2007 (JP) .................................. 2007-330352

(51) Int. Cl.
G06F 12/00 (2006.01)
(52) U.S. Cl. ............ 711/105; 711/5; 711/114; 711/156; 711/202
(58) Field of Classification Search .................. None
See application file for complete search history.

(56) References Cited

U.S. PATENT DOCUMENTS

| | | | |
|---|---|---|---|
| 5,487,024 A | 1/1996 | Girardeau, Jr. | |
| 5,875,147 A | 2/1999 | Park | |
| 6,370,636 B1 | 4/2002 | Park | |
| 7,702,846 B2 | 4/2010 | Nakanishi et al. | |
| 2001/0017628 A1 | 8/2001 | Sunaga | |
| 2002/0129188 A1 | 9/2002 | Fleck et al. | |
| 2004/0037133 A1 | 2/2004 | Park et al. | |
| 2005/0144369 A1 | 6/2005 | Jaspers | |
| 2006/0190671 A1 | 8/2006 | Jeddeloh | |
| 2006/0250879 A1 | 11/2006 | Jeddeloh | |
| 2007/0208919 A1 | 9/2007 | Tanaka et al. | |
| 2008/0086621 A1 | 4/2008 | Ogura | |

FOREIGN PATENT DOCUMENTS

| | | |
|---|---|---|
| JP | 5-100948 | 4/1993 |
| JP | 10-116226 | 5/1998 |
| JP | 2001-243771 | 9/2001 |
| JP | 2005-517242 | 6/2005 |
| WO | 03/067445 | 8/2003 |
| WO | 2006/091283 | 8/2006 |

OTHER PUBLICATIONS

U.S. Appl. No. 12/864,691 entitled "Memory Access Timing Adjustment Device and Memory Access Timing Adjustment Method" to Toshiyuki Kajimura, Jul. 27, 2010.

*Primary Examiner* — Shawn X Gu
(74) *Attorney, Agent, or Firm* — McDermott Will & Emery LLP

(57) ABSTRACT

A memory device according to this invention includes: N internal memory read buses and N internal memory write buses each including a plurality of internal slots; N memory modules; an output data bus and an input data bus each including a plurality of external slots; a read data processing unit which (i) selects, from pieces of data read from the N memory modules via the N internal memory read buses, pieces of data read via two or more internal slots, and (ii) provides the selected pieces of data to external slots of the output data bus; and a write data processing unit which provides each of pieces of data provided via the external slots included in the input data bus, to one of the internal slots included in the N internal memory write buses, so as to write the pieces of data to the N memory modules.

16 Claims, 12 Drawing Sheets

Data Strobe Signal 261

External Data Bus 161

Data Strobe Signal 261

External Data Bus 161

FIG. 11

| | Bandwidth [MByte/s] | Minimum Access Granularity [Byte] | External Clock Frequency [MHz] | Internal Clock Frequency [MHz] | External Data Bus Frequency [MHz] | External Data Bus Width [Byte] |
|---|---|---|---|---|---|---|
| Conventional (DDR2-800, 4-byte Bus) | 3200 | 16 | 400 | 200 | 800 | 4 |
| The Present Invention (Method X + P) | 3200 | 4 | 400 | 200 | 800 | 4 |
| The Present Invention (Method X + Q) | 3200 | 4 | 400 | 100 | 400 | 8 |
| The Present Invention (Method Y + P) | 3200 | 4 | 400 | 200 | 800 | 4 |
| The Present Invention (Method Y + Q) | 3200 | 4 | 400 | 100 | 400 | 8 |

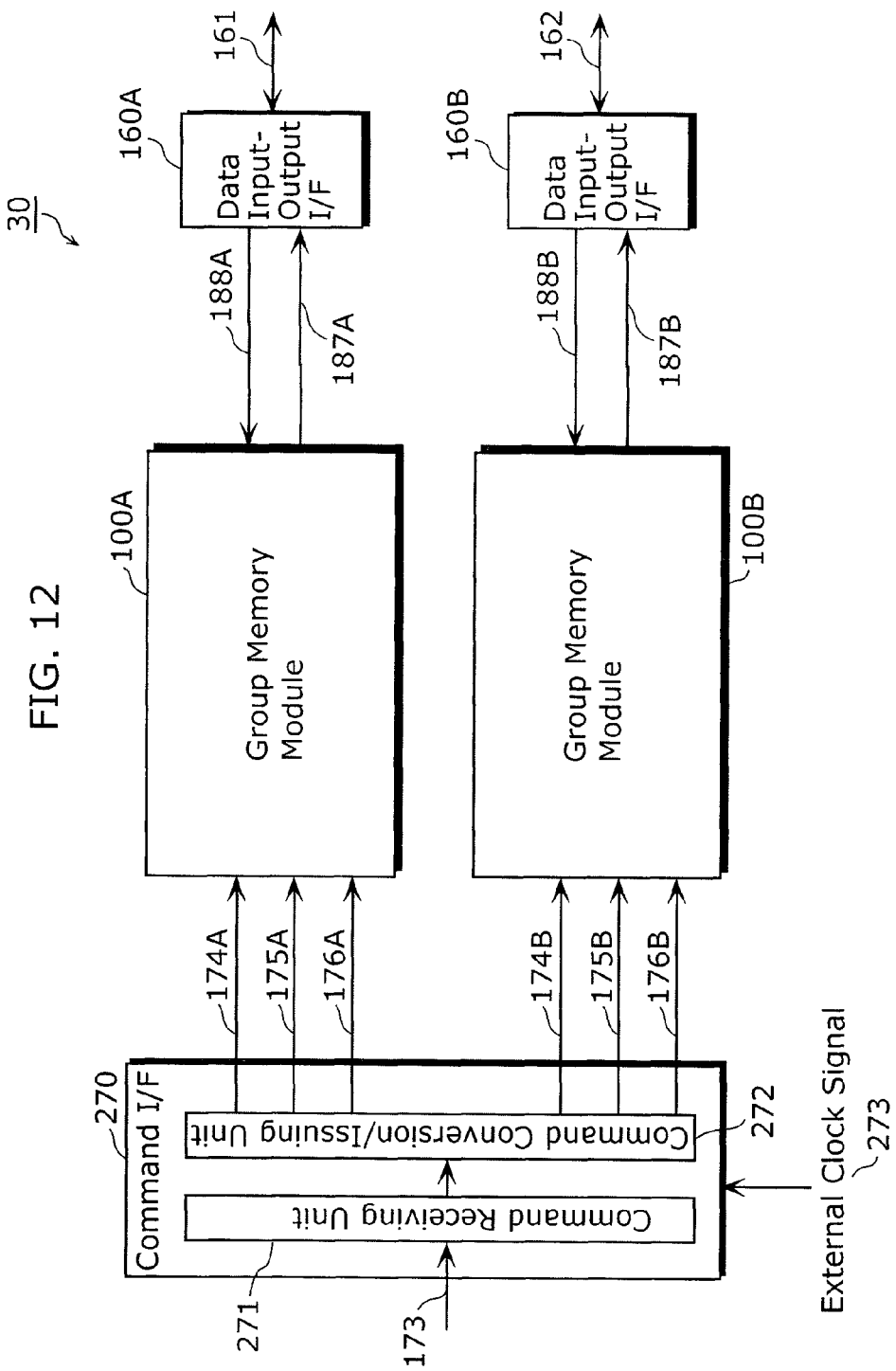

MEMORY DEVICE AND MEMORY DEVICE CONTROL METHOD

TECHNICAL FIELD

The present invention relates to memory devices and control methods thereof, and more particularly to a memory device from and to which data can be read and written.

BACKGROUND ART

In general, information processing devices including image processing devices use a Dynamic Random Access Memory (DRAM) with a large capacity and a low cost in order to store a huge amount of data. Especially, recent image processing devices are required, for example, to correspond to High Definition (HD) image processing according to standards such as MPEG-2 and H.264, to deal with a plurality of channels at once, and to process high-resolution 3-dimensional graphics. Therefore, the devices need a DRAM having high-level data transfer performance (hereinafter, referred to as a "memory band") as well as a large capacity.

Well known methods for achieving a high memory band are a method (1) by increasing a bus operating frequency, a method (2) by increasing of a bus width of a memory, and a method by combining (1) with (2).

In general, in order to access a DRAM, activation processing is to be performed by previously designating a bank and a row to be accessed. If a row to be accessed is to be changed to another in the same bank, pre-charge processing is performed on an accessed row and activation processing is performed on a next row to be accessed. During the activation processing and the pre-charge processing, it is impossible to access the bank. Therefore, switching of rows in the same bank produces a time period during which access is impossible (hereinafter, referred to as an "inaccessible period"). As a result, there is a drawback of producing an idle time of a data bus.

In order to overcome the drawback, so-called bank interleave control is performed when accesses to a DRAM are controlled. In the bank interleave control, while data is transferred to a certain bank, activation processing and pre-charge processing are performed for a different bank. Thereby, an inaccessible period is concealed, and data can be virtually transferred any time on a data bus. The bank interleave control can efficiently work, when an inaccessible period for a certain bank is shorter than a data transfer period for a different bank.

Whichever of the above methods (1) and (2) is adopted to achieve a high memory band, an absolute period of the inaccessible period is never changed while a data transfer amount for each unit time is increased. Therefore, a data transfer amount required to conceal an inaccessible period is also increased. This means that a data transfer amount required to conceal an inaccessible period is increased.

As a result, the bank interleave control cannot adequately conceal an inaccessible period, unless a data transfer amount for other banks is increased, in other words, unless a transfer size for each access is increased. Thereby, a data bus has an idle time, causing a problem of reducing access efficiency. This significantly reduces access efficiency in a system having frequent accesses with a small transfer size.

One of conventional techniques of addressing the above problem is disclosed in Patent Reference 1. In the technique of Patent Reference 1, a plurality of memory devices in a single logical address space are accessed via respective different address buses. This structure improves access efficiency in terms of a total data bus width of the memory devices.

In the technique of Patent Reference 1, an address bus is independently controlled for each memory device. Therefore, a minimum access unit is reduced more than that in the situation where a single address bus is shared among a plurality of memory devices. The technique of Patent Reference 1 can thereby eliminate unnecessary data for the total data bus width of the memory devices. As a result, the technique of Patent Reference 1 can suppress reducing access efficiency in a system having frequent accesses with a small transfer size.
Patent Reference 1: Japanese Unexamined Patent Application Publication (Translation of PCT Application) No. 2005-517242

DISCLOSURE OF INVENTION

Problems that Invention is to Solve

In general, a minimum access unit of a DRAM is "bus width x minimum burst count". While a minimum burst count of a Synchronous Dynamic Random Access Memory (SDRAM) is regulated as 1, a minimum burst count of the above-mentioned high-speed DRAM is regulated as 2 for double data rate (DDR), 4 for DDR2, and 8 for DDR8. Therefore, like the situation of increasing a bus width, also in the situation of adopting the high-speed DRAM, there is still a problem of increase of a minimum access unit.

A minimum access unit refers to a minimum amount of data that should be transferred for one access. Any access request is transferred having an amount that is integral multiple of a minimum access unit. Therefore, increase of a minimum access unit results in frequent unnecessary transfers of accesses with a small transfer amount and arbitrary and non-continuous accesses often seen in image processing. As a result, effective transfer efficiency is reduced.

In other words, in the technique of Patent Reference 1, a bus width is focused to reduce a minimum access unit, in order to access each data bus independently by using a plurality of devices. However, if a DRAM that is speedier than a SDRAM is used, a minimum burst count is increased as 2 for DDR, 4 for DD2, and 8 for DD3. As a result, a minimum access unit cannot be reduced. Therefore, if a speedier DRAM (with DDR, DDR2, DDR3, or the like) is adopted, the increase of a minimum burst count increases a minimum access unit. Thereby, there is a problem of deteriorating access efficiency.

In this case, the minimum access unit deteriorated due to the increase of the minimum burst count can be improved by using more memory devices. However, the increase of memory devices causes another problem of increasing a cost.

In order to solve the above problems, an object of the present invention is to provide a memory device capable of achieving high access efficiency and suppressing increase in cost.

Means to Solve the Problems

In accordance with an aspect of the present invention for achieving the object, there is provided a memory device from and to which data corresponding to a first size can be read and written, the memory device comprising: an address holding unit configured to hold N addresses where N is an integer of 2 or more; N read buses and N write buses, each of the N read buses and the N write buses having a bus width of a second size and including first slots, each of the first slots being a partial bus having a bus width of a third size; N memory modules each uniquely connected to a corresponding one of the N read buses and a corresponding one of the N write buses, each of the N memory modules holding data for each address designated by a corresponding one of the N addresses held in the address holding unit; an output data bus and an input data bus each having a bus width of the first size and including second slots, each of the second slots being a partial bus having a bus width of the third size; a read data processing unit configured to (i) select, from among pieces of data read from the N memory modules via the N read buses, pieces of data read via two or more first slots from among the first slots included in the N read buses, and (ii) provide the selected pieces of data to second slots from among the second slots included in the output data bus; and a write data processing unit configured to provide each of pieces of data provided via the second slots included in the input data bus, to a corresponding one of the first slots included in the N write buses, so as to write the pieces of data to the N memory modules.

With the above structure, in the memory device in accordance with the aspect of the present invention, one input-output operation can access pieces of data having different addresses, without changing a transfer size of Read data or a transfer size of Write data. Thereby, the memory device in accordance with the aspect of the present invention can reduce a minimum access unit of data, thereby achieving high access efficiency. In addition, the memory device in accordance with the aspect of the present invention can achieve the high access efficiency without increasing the number of embedded memory modules like conventional memory devices do. As a result, the memory device in accordance with the aspect of the present invention can achieve the high access efficiency and also suppress increase in a cost.

Further, the memory device may further include a slot address processing unit configured to obtain a slot address indicating a one-to-one relationship between a first position of one of the first slots and a second position of one of the second slots, wherein the read data processing unit is configured to (i) select a piece of data read via the one of the first slots at the first position indicated by the slot address, from among pieces of data read via the first slots included in the N read buses, and (ii) provides the selected piece of data to the one of the second slots at the second position associated with the first position, and the write data processing unit is configured to provide a piece of data provided via the one of the second slots included in the input data bus, to the one of the first slots at the first position associated with the second position of the one of the second slots indicated in the slot address.

With the above structure, the memory device in accordance with the aspect of the present invention can allocate pieces of data to any desired combinations between the external slots and the internal slots based on the slot address.

Furthermore, the slot address may include second slot addresses and first slot addresses, the second slot addresses each designating a second position of a corresponding one of the second slots, and the first slot addresses each designating a first position of the first slots each associated with a corresponding one of the second slots, each of the first slot addresses may include a first address and a second address, the first address designating one of the N read buses and said N write buses, and the second address designating a first position of a first slot from among the first slots included in each of the N read busses and the N write buses, the read data processing unit may be configured to (i) select a piece of data read via a first slot at the first position designated by the second address, from among pieces of data read via the first slots included in the one of the N read buses designated by the first address, and (ii) provide the selected piece of data to a second slot at the second position designated by the second slot address, the second slot address associated with the first slot address including the first address and the second address used in the selection, and the write data processing unit may be configured to provide a piece of data provided via a second slot at the second position designated by the second slot address, to a first slot at the first position designated by the second address included in the first slot address associated with the second slot address, the first slot being included in one of the N write buses designated by the first address included in the first slot address.

With the above structure, the memory device in accordance with the aspect of the present invention can access data having a desired address in a desired memory module based on the slot address.

Still further, the write data processing unit may be configured to assign a first slot with a flag, the first slot not being provided with any piece of data via any one of the second slots, and the flag being used for instructing not to write any piece of data to any one of the N memory modules via the first slot assigned with the flag.

With the above structure, the memory device in accordance with the aspect of the present invention can prohibit writing to an address where stored data is not necessary to be changed.

Still further, the write data processing unit may be configured to (i) provide the piece of data provided via the second slot at the second position designated by the second slot address, to the first slot in each of the N write buses, the first slot being located at the first position designated by the second address included in the first slot address associated with the second slot address, and (ii) assign, for each of the N write buses which is designated by the first address, a first slot with a flag, the first slot not being provided with any piece of data via any one of the second slots, and the flag being used for instructing not to write any piece of data to any one of the N memory modules via the first slot assigned with the flag.

With the above structure, the memory device in accordance with the aspect of the present invention can allocate pieces of data from the external slots to the internal slots, by the easy mask-assigning processing.

Still further, the first size may be equal to the second size.

Still further, each of the N read buses and the N write buses may include N first slots that are the first slots, and each of the output data bus and the input data bus may include N second slots that are the second slots.

Still further, the memory device may further include a command interface which (i) receives a plurality of commands in one cycle of a signal based on a synchronizing signal supplied from outside, and (ii) converts the received plurality of commands to generate (a) N addresses of the N memory modules and (b) the slot address, wherein the address holding unit is configured to hold the N addresses generated by the command interface, and the slot address processing unit is configured to obtain the slot address generated by the command interface.

With the above structure, it is possible to suppress increase in a frequency of the external clock or a bus width of an external command bus.

Still further, the command interface may receive N commands that are the plurality of commands in one cycle of the signal based on the synchronizing signal.

With the above structure, the memory device in accordance with the aspect of the present invention can receive commands for all memory modules, in one cycle of the signal based on the synchronizing signal.

Still further, the memory device may further include a data input-output interface which (i-1) converts Write data to correspond to the first size, the Write data being supplied from an external data bus and corresponding to a bus width of the external data bus and (i-2) provides the converted Write data to the input data bus, and which (ii-1) converts Read data to correspond to the bus width of the external data bus, the Read data corresponding to the first size of the bus width of the output data bus and (ii-2) provides the converted Read data to the external data bus, wherein the data input-output interface (i) receives, in one cycle of the signal based on the synchronizing signal supplied from outside, pieces of data each supplied from the external data bus and corresponding to the bus width of the external data bus, and (ii) provides, in one cycle of the signal based on the synchronizing signal supplied from outside, pieces of Read data including the Read data each converted to correspond to the bus width of the external data bus, to the external data bus.

With the above structure, it is possible to suppress increase in a frequency of the external clock or a bus width of the external data bus.

Still further, the memory device may further include: a plurality of group memory modules each including the N memory modules, the N read buses, the N write buses, the address holding unit, the read data processing unit, the write data processing unit, the output data bus, the input data bus, and the slot address processing unit; and a command interface which converts a command supplied from outside to generate (a) addresses of the plurality of group memory modules and (b) the slot address, wherein the address holding unit in each of the plurality of group memory modules is configured to hold a corresponding one of the addresses generated by the command interface, and the slot address processing unit in each of the plurality of group memory modules is configured to obtain the slot address generated by the command interface.

With the above structure, it is possible to access another group memory module on a data bus to the outside in an inaccessible time period of a certain group memory module in which the certain group memory module is physically inaccessible on the data bus. As a result, the memory device in accordance with the aspect of the present invention can improve efficiency of the data bus.

Still further, the command interface may receive a plurality of commands in one cycle of a signal based on a synchronizing signal supplied from outside.

With the above structure, it is possible to suppress increase in a frequency of the external clock or a bus width of the external command bus.

Still further, the command interface may receive the plurality of commands corresponding to the number of the plurality of group memories, in one cycle of the signal based on the synchronizing signal.

With the above structure, the memory device in accordance with the aspect of the present invention can receive commands for all memory modules, in one cycle of the signal based on the synchronizing signal.

Still further, the memory device may further include a data input-output interface which (i-1) converts Write data to correspond to the first size, the Write data being supplied from an external data bus and corresponding to a bus width of the external data bus and (i-2) provides the converted Write data to the input data bus in each of the plurality of group memory modules, and which (ii-1) converts Read data to corresponding to the bus width of the external data bus, the Read data corresponding to the first size of the output data bus in each of the plurality of group memory modules and (ii-2) provides the converted Read data to the external data bus, wherein the data input-output interface (i) receives, in one cycle of the signal based on the synchronizing signal supplied from outside, pieces of data each supplied from the external data bus and corresponding to the bus width of the external data bus, and (ii) provides, in one cycle of the signal based on the synchronizing signal supplied from outside, pieces of Read data including the Read data each converted to correspond to the bus width of the external data bus, to the external data bus.

With the above structure, it is possible to suppress increase in a frequency of the external clock or a bus width of the external data bus.

Still further, the memory device may further include a plurality of data input-output interfaces each corresponding to a corresponding one of the plurality of group memory modules, each of the plurality of data input-output interfaces (i) converting Write data to correspond to the first size, the Write data being supplied from an external data bus and corresponding to a bus width of the external data bus and (i-2) providing the converted Write data to the input data bus in each of the plurality of group memory modules, and (ii-1) converting Read data to corresponding to the bus width of the external data bus, the Read data corresponding to the first size of the output data bus in each of the plurality of group memory modules and (ii-2) providing the converted Read data to the external data bus, wherein each of the plurality of data input-output interfaces (i) receives, in one cycle of the signal based on the synchronizing signal supplied from outside, pieces of data each supplied from the external data bus and corresponding to the bus width of the external data bus, and (ii) provides, in one cycle of the signal based on the synchronizing signal supplied from outside, pieces of Read data including the Read data each converted to correspond to the bus width of the external data bus, to the external data bus.

In accordance with another aspect of the present invention, there is provided a control method of controlling a memory device from and to which data corresponding to a first size can be read and written, the memory device including: an address holding unit configured to hold N addresses where N is an integer of 2 or more; N read buses and N write buses, each of the N read buses and the N write buses having a bus width of a second size and including first slots, each of the first slots being a partial bus having a bus width of a third size; N memory modules each uniquely connected to a corresponding one of the N read buses and a corresponding one of the N write buses, each of the N memory modules holding data for each address designated by a corresponding one of the N addresses held in the address holding unit; and an output data bus and an input data bus each having a bus width of the first size and including second slots, each of the second slots being a partial bus having a bus width of the third size, the control method comprising: (i) selecting, from among pieces of data read from the N memory modules via the N read buses, pieces of data read via two or more first slots from among the first slots included in the N read buses, and (ii) providing the selected pieces of data to second slots from among the second slots included in the output data bus; and providing each of pieces of data provided via the second slots included in the input data bus, to a corresponding one of the first slots included in the N write buses, so as to write the pieces of data to the N memory modules.

As described above, by the control method in accordance with the another aspect of the present invention, a single input-output operation can access pieces of data having a plurality of different addresses, without changing a transfer size of Read data and a transfer size of Write data. Thereby, the control method in accordance with the aspect of the present invention can reduce a minimum access unit of data, thereby achieving high access efficiency. In addition, the control method in accordance with the aspect of the present invention can achieve the high access efficiency without increasing the number of embedded memory modules like conventional memory device control methods do. As a result, the control method in accordance with the aspect of the present invention can achieve the high access efficiency and also suppress increase in a Cost.

It should be noted that the present invention can be implemented not only as the above memory device, but also as: the memory device control method including steps performed by the characteristic units of the memory device: a program causing a computer to execute the characteristic steps; and the like. Of course, the program can be distributed by a recording medium such as a Compact Disc-Read Only Memory (CD-ROM) or by a transmission medium such as the Internet.

Effects Of The Invention

As described above, the present invention can provide a memory device capable of achieving high access efficiency and suppressing increase in cost.

BRIEF DESCRIPTION OF DRAWINGS

FIG. 11 is a table of a minimum access granularity, internal clock frequency, and the like of the memory device according to the second embodiment of the present invention.

FIG. 12 is a block diagram showing a structure of a memory device according to a variation of the second embodiment of the present invention.

Figure 1:
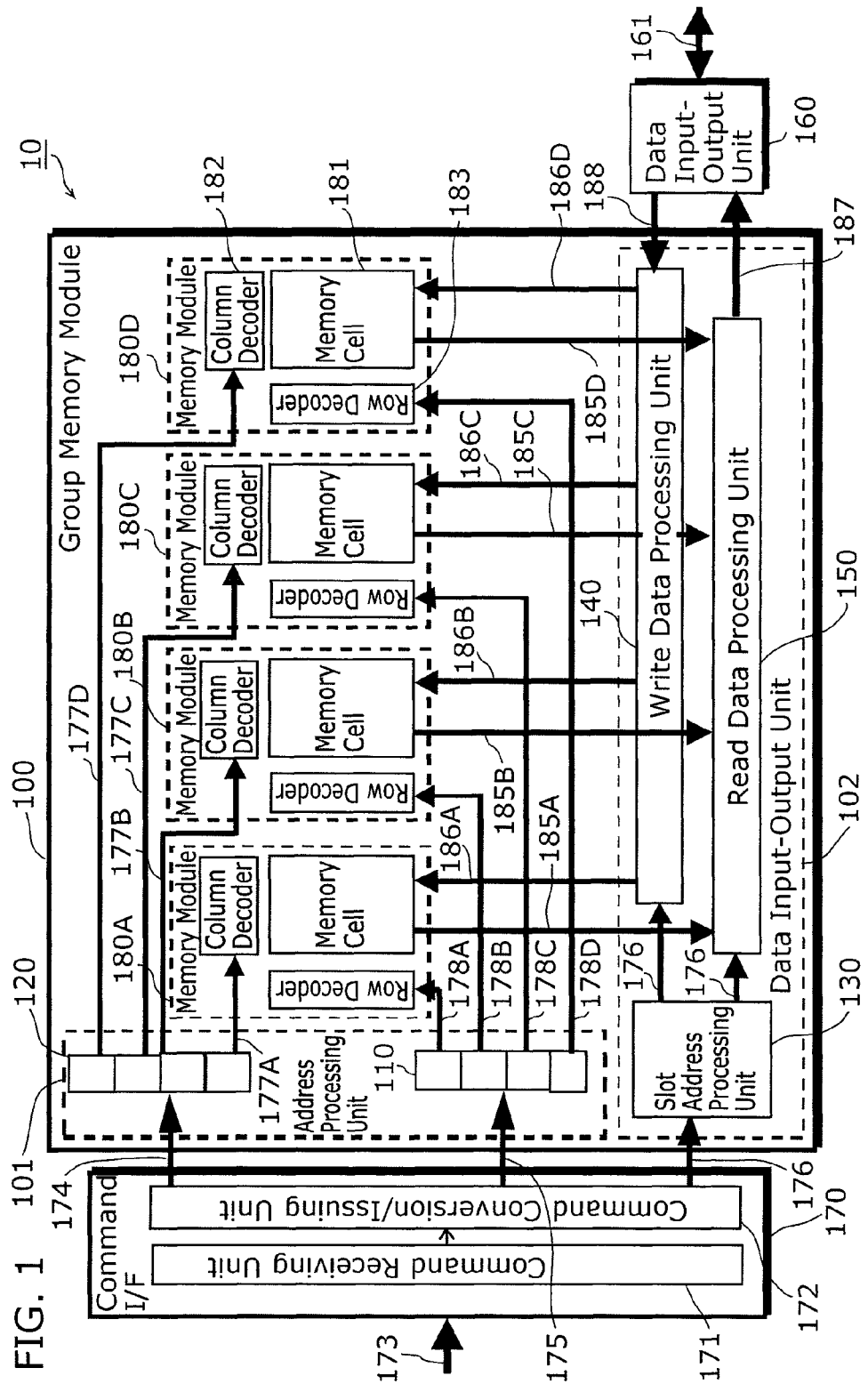
FIG. 1 is a block diagram showing a structure of a memory device according to a first embodiment of the present invention.

NUMERICAL REFERENCES 10, 20, 30 memory device
100, 100A, 100B group memory module
101 address processing unit
102 data input-output unit
110 row address processing unit
120 column address processing unit
130 slot address processing unit
140 Write data processing unit
150 Read data processing unit
160, 160A, 160B, 260 data input-output I/F
161, 162 external data bus
170, 270 command I/F
171, 271 command receiving unit
172, 272 command conversion/issuing unit
173 external command bus
174, 174A, 174B, 177, 177A, 177B, 177C, 177D column address
175, 175A, 175B, 178, 178A, 178B, 178C, 178D row address
176, 176A, 176B slot address 180, 180A, 180B, 180C, 180D memory module
181 memory cell
182 column decoder
183 row decoder
185, 185A, 185B, 185C, 185D internal memory read bus
186, 186A, 186B, 186C, 186D internal memory write bus
187, 187A, 187B output data bus
188, 188A, 188B input data bus
201 external slot address
202 internal slot address
203 upper slot address
204 lower slot address
210 internal slot
211 external slot
261 data strobe signal
273 external clock signal

BEST MODE FOR CARRYING OUT THE INVENTION

The following describes memory devices according to embodiments of the present invention with reference to the drawings.

First Embodiment

A memory device according to a first embodiment of the present invention includes a plurality of memory modules which are accessible at once. In data writing, the memory device according to the first embodiment of the present invention divides Write data provided from the outside into pieces according to a plurality of slots, and writes each divided piece of data into a corresponding one of the memory modules. On the other hand, in data reading, the memory device according to the first embodiment of the present invention divides data read from the respective memory modules into pieces according to the slots, and generates Read data by combining pieces of data read via designated slots from among the divided slots. Thereby, the memory device according to the first embodiment of the present invention can achieve high access efficiency and suppress increase in cost.

First, a structure of the memory device according to the first embodiment of the present invention is described.

FIG. 1 is a block diagram showing the structure of the memory device according to the first embodiment of the present invention.

The memory device 10 shown in FIG. 1 is a memory device to and from which data can be read and written in units of total m bits. The memory device 10 holds m-bit Write data provided from an external data bus 161, according to an internal command issued via an external command bus 173. In addition, the memory device 10 provides a m-bit Read data of the held data to the external data bus 161, according to an external command issued via the external command bus 173.

The memory device 10 includes a group memory module 100, a data input-output interface (I/F) 160, and a command I/F 170. The memory device 10 is implemented, for example, as a single or multiple semiconductor integrated circuit(s).

The group memory module 100 includes an address processing unit 101, a data input-output unit 102, four memory modules 180A to 180D, internal memory read buses 185A to 185D, internal memory write buses 186A to 186D, an output data bus 187, and an input data bus 188. Hereinafter, if it is not necessary to distinguish the memory modules 180A to 180D from each other, they are expressed as memory modules 180. Likewise, if it is not necessary to distinguish the internal memory read buses 185A to 185D, they are expressed as internal memory read buses 185. Furthermore, if it is not necessary to distinguish the internal memory write buses 186A to 186D, they are expressed as internal memory write buses 186.

The command I/F 170 includes a command receiving unit 171 and a command conversion/issuing unit 172.

The command receiving unit 171 receives an external command supplied via the external command bus 173. The external command instructs an operation of the memory device 10. More specifically, the external command includes an external address, information for designating reading and writing, a signal for controlling timings of the operation. Furthermore, the command receiving unit 171 receives four external commands for the respective memory modules 180, for each access to the group memory module 100.

The command conversion/issuing unit 172 converts the external address included in the external command received by the command receiving unit 171, into internal addresses of the memory device 10. The internal addresses are a column address 174, a row address 175, and a slot address 176. The command conversion/issuing unit 172 provides the column address 174 to a column address processing unit 120, the row address 175 to a row address processing unit 110, and the slot address 176 to a slot address processing unit 130. Each of the column address 174, the row address 175, and the slot address 176 includes sub-addresses corresponding to the respective four memory modules 180.

From the information for designating reading and writing, the signal for controlling timings of an operation, and the like included in the external command, the command I/F 170 generates an activation signal, a Read instruction signal, and a Write instruction signal, which will be described later. The command I/F 170 provides the generated activation signal, Read instruction signal, and Write instruction signal to the group memory module 100.

The address processing unit 101 has four addresses each corresponding to the respective four memory modules 180. The address processing unit 101 includes the row address processing unit 110 and the column address processing unit 120.

The row address processing unit 110 holds row addresses 178A to 178D that correspond to the memory modules 180A to 180D, respectively. The row addresses 178A to 178D are included in the row address 175 provided from the command conversion/issuing unit 172. The row address processing unit 110 holds the row addresses 178A to 178D until accesses (reading or writing) to the memory modules 180 are completed. Here, if it is not necessary to distinguish the row addresses 178A to 178D from each other, they are expressed as row addresses 178.

The column address processing unit 120 holds column addresses 177A to 177D that correspond to the memory modules 180A to 180D, respectively. The column addresses 177A to 177D are included in the column address 174 provided from the command conversion/issuing unit 172. The column address processing unit 120 holds the column addresses 177A to 177D until accesses to the memory modules 180 are completed. Here, if it is not necessary to distinguish the column addresses 177A to 177D from each other, they are expressed as column addresses 177.

Each of the memory modules 180 holds data for each address that is designated by one of four sets of addresses held in the address processing unit 101. Each of the four memory modules 180A to 180D is uniquely connected to a corresponding one of the four internal memory read buses 185A to 185D and a corresponding one of the four internal memory write buses 186A to 186D. Each of the memory modules 180 includes a memory cell 181, a column decoder 182, and a row decoder 183. The memory modules 180 are implemented as DRAMs for example.

The memory cell 181 includes a plurality of memory elements which are arranged in rows and columns. Each of the memory elements holds a piece of m-bit data.

The column decoder 182 decodes an input corresponding column address 177 to select a predetermined column in the memory cell 181. The row decoder 183 decodes an input corresponding row address 178 to select a predetermined row in the memory cell 181.

In the memory cell 181 in each of the memory module 180, data is read from and written to an memory element having an address that is expressed by the column selected by the column decoder 182 and the row selected by the row decoder 183.

The data input-output unit 102 includes the slot address processing unit 130, a Write data processing unit 140, and a Read data processing unit 150.

The slot address processing unit 130 obtains the slot address 176 from the command I/F 170. The slot address processing unit 130 holds the slot address 176 until accesses to the memory modules 180 are completed.

The Write data processing unit 140 is connected to the memory modules 180A to 180D via the internal memory write buses 186A to 186D, respectively.

Based on the slot address 176 provided from the slot address processing unit 130, the Write data processing unit 140 allocates pieces of Write data provided from the input data bus 188, to slots of the internal memory write buses 186. In addition, the Write data processing unit 140 sets a data mask flag for a position of any unnecessary slot.

The Read data processing unit 150 is connected to the memory modules 180A to 180D via the internal memory read buses 185A to 186D, respectively. Based on the slot address 176 provided from the slot address processing unit 130, the Read data processing unit 150 divides (in other words, allocates) pieces of data read via slots of the internal memory read buses 185 into pieces, and provides a set of the divided pieces of data as being a total piece of Read data, to the output data bus 187.

Each of the internal memory read buses 185 has a bus width of m bits. Each of the internal memory write buses 186 has a bus width of m bits. Each of the output data bus 187 and the input data bus 188 has a bus width of m bits.

The data input-output I/F 160 is connected to the Read data processing unit 150 via the output data bus 187. The data input-output I/F 160 converts m-bit Read data to correspond to (in other words, to be capable of being carried by) the bus width of the external data bus 161. The data input-output I/F 160 provides the converted Read data to the external data bus 161. More specifically, the data input-output I/F 160 divides Read data received from the output data bus 187 into pieces based on an external clock, and provides the divided pieces of Read data to the external data bus 161. Here, the external clock is a synchronization clock supplied from the outside. It should be noted that the data input-output I/F 160 may use, instead of the external clock, a timing signal that varies depending on timing changes of the external clock.

The data input-output I/F 160 is connected to the Write data processing unit 140 via the input data bus 188. The data input-output I/F 160 converts Write data supplied via the external data bus 161, which corresponds to the bus width of the external data bus 161, in order to correspond to a bus width of m bits. The data input-output I/F 160 provides the converted Write data to the input data bus 188. More specifically, the data input-output I/F 160 retrieves based on the external clock, Write data received via the external data bus 161, and provides the retrieved Write data to the input data bus 188.

Next, the operation performed by the memory device 10 according to the first embodiment of the present invention is described.

Figure 2:
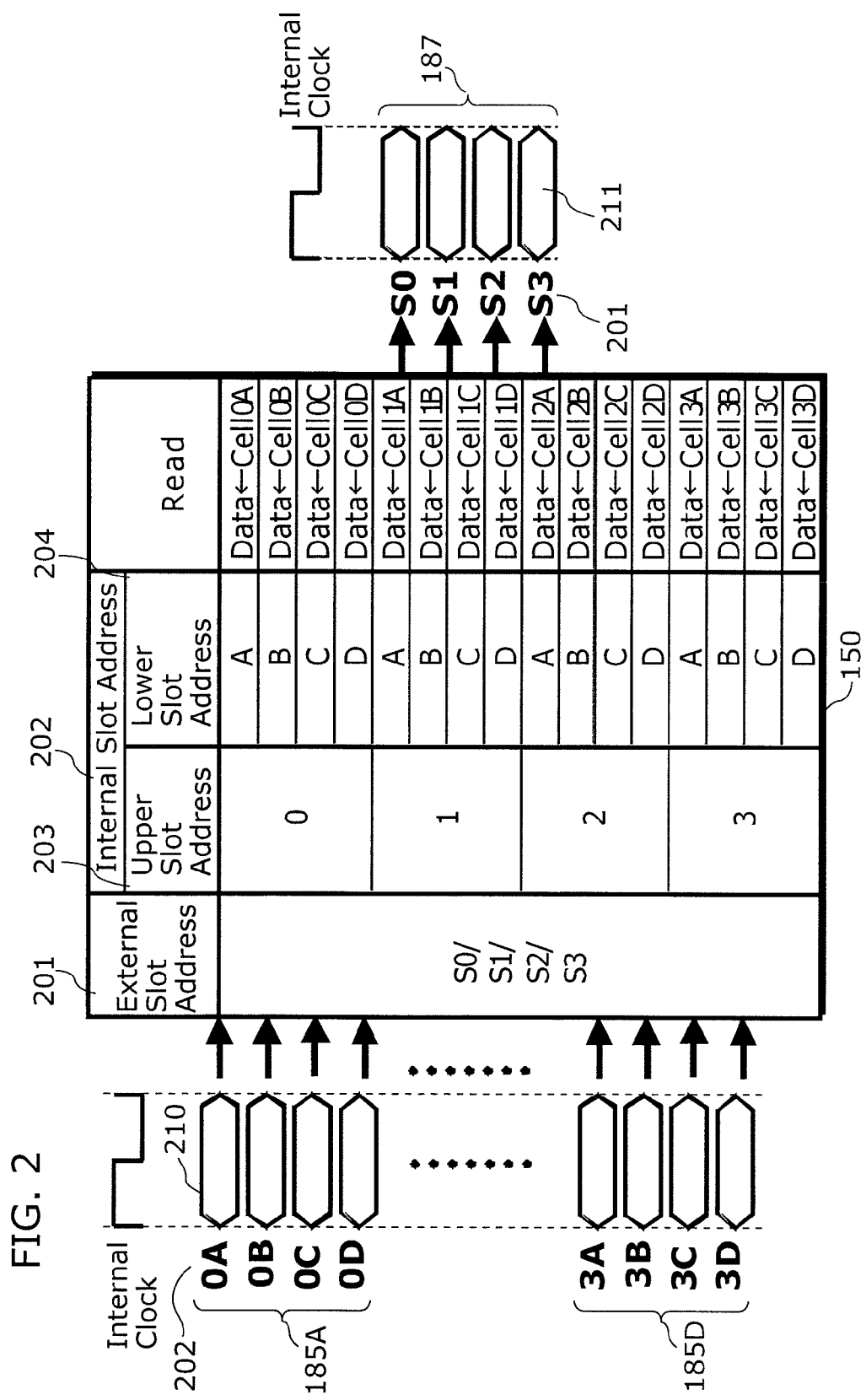
FIG. 2 is a diagram showing operation performed by a Read data processing unit according to the first embodiment of the present invention.

FIG. 2 is a diagram showing operation performed by the Read data processing unit 150 in data reading. Cell0 to Cell3 in FIG. 2 correspond to the memory modules 180A to 180D, respectively.

In data reading, each of the memory modules 180 provides a piece of m-bit Read data to a corresponding one of the internal memory read buses 185A to 185D. Each of the internal memory read buses 185 has four internal slots 210. One internal slot 210 is a data unit obtained by dividing (a) a m-bit bus width of each of the internal memory read buses 185 and the internal memory write buses 186, by (b) four that is the number of the memory modules. In other words, the internal slots 210 are partial buses of each of the internal memory read buses 185 and the internal memory write buses 186.

Based on the slot address 176 provided from the slot address processing unit 130, the Read data processing unit 150 divides (allocates) data read via the slots of the internal memory read buses 185 into pieces, thereby providing a set of the divided pieces of data as being a total piece of Read data, to the output data bus 187.

The output data bus 187 includes four external slots 211. One external slot 211 is a data unit obtained by dividing (a) a m-bit bus width of each of the output data bus 187 and the input data bus 188, by (b) four that is the number of the memory modules. In other words, the external slots 211 are partial buses of each of the output data bus 187 and the input data bus 188.

Based on the slot address 176 provided from the slot address processing unit 130, the Read data processing unit 150 selects pieces of data read via four internal slots 210, from among pieces of data read via the internal slots 210 of the four internal memory read buses 185 from the four memory modules 180. The Read data processing unit 150 allocates the selected pieces of data to the external slots 211 of the output data bus 187.

The slot address 176 is information indicating one-to-one relationships between positions of internal slots 210 and positions of external slots 211. The slot address 176 includes (a) four external slot addresses 201 and (b) internal slot addresses 202 associated with the respective four external slot addresses 201.

Each of the external slot addresses 201 is an address for designating a position of a corresponding one of the external slots 211.

Each of the internal slot addresses 202 is an address for designating a position of a corresponding one of the internal slots 210. Here, a single internal slot address 202 has 4 bits.

Each of the internal slot addresses 202 includes an upper slot address 203 having 2 bits and a lower slot address 204 having 2 bits.

Each upper slot address 203 is expressed by upper 2 bits in a corresponding internal slot address 202. Each upper slot address 203 designates any one of the memory modules 180A to 180D. In other words, one upper slot address 203 designates one of the internal memory read buses 185A to 185D or one of the internal memory write buses 186A to 186D.

Each lower slot address 204 is expressed by lower 2 bits in a corresponding internal slot address 202. The lower slot address 204 designates any one of internal slots 210 included in each of the internal memory read buses 185 or each of the internal memory write buses 186.

The Read data processing unit 150 selects pieces of data read via internal slots 210 designated by the lower slot addresses 204 included in the internal memory read buses 185 designated by the upper slot addresses 203. Based on the slot address 176, the Read data processing unit 150 provides each of the selected pieces of data to a corresponding external slot 211 designated by an external slot address 201 that is associated with an internal slot address 202 having the upper slot address 203 and the lower slot address 204 of the selected piece of data.

The Read data processing unit 150 determines the internal slots 210 designated by the four internal slot addresses 202 included in the slot address 176. The Read data processing unit 150 provides the selected pieces of data read via the designated four internal slots 210, to the external slots 211 associated with the designated internal slots 210.

As described above, based on the slot address 176, the Read data processing unit 150 selects pieces of data read via four internal slots 210, from among pieces of data having total 4×m bits which are read from the four memory modules 180. Thereby, the Read data processing unit 150 outputs a set of the selected pieces of data, as being a piece of m-bit Read data.

Figure 3:
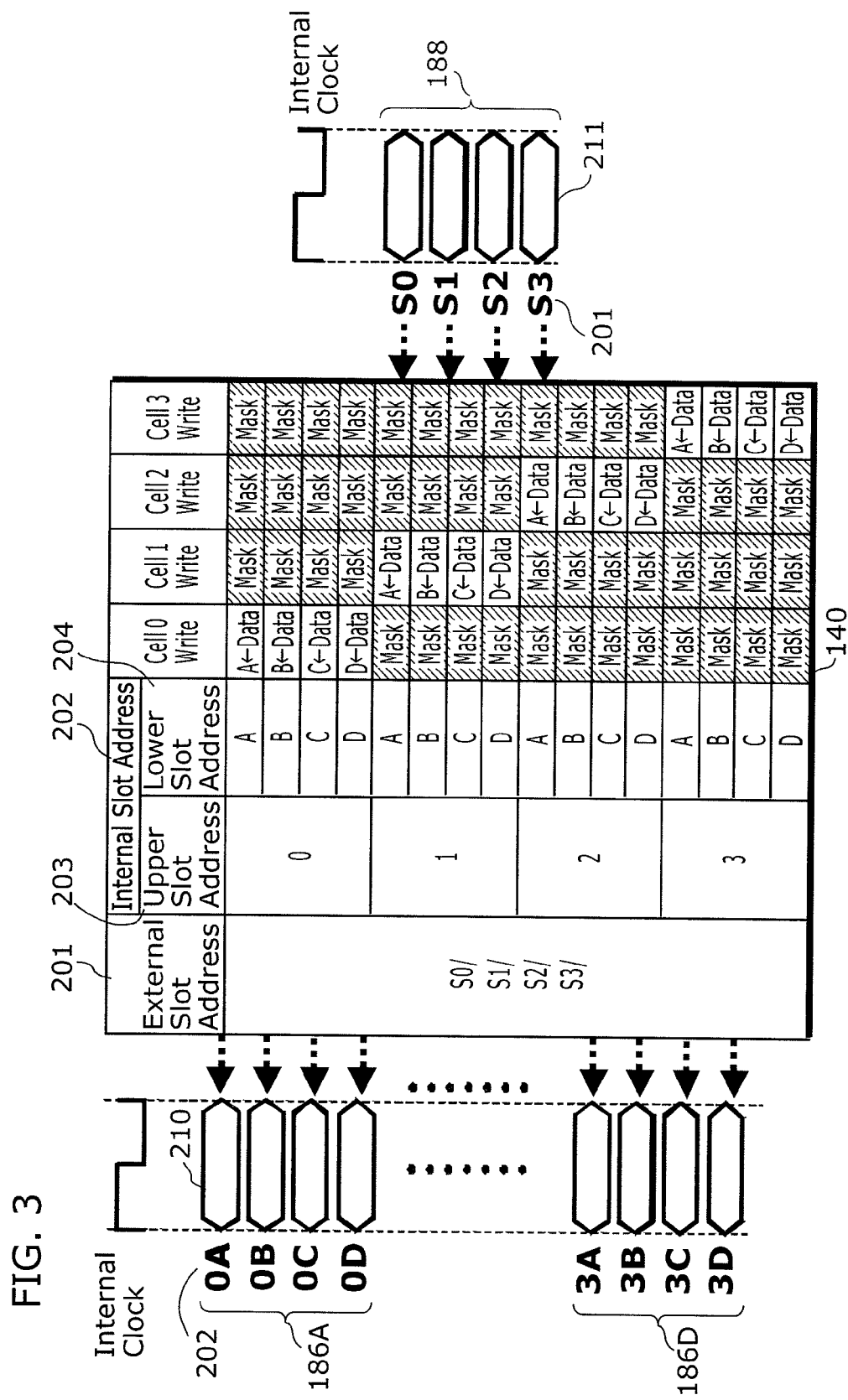
FIG. 3 is a diagram showing operation performed by a Write data processing unit according to the first embodiment of the present invention.

FIG. 3 is a diagram showing operation performed by the Write data processing unit 140 in data writing. Cell0 to Cell3 in FIG. 3 correspond to the memory modules 180A to 180D, respectively.

In data writing, the data input-output I/F 160 provides m-bit Write data to the input data bus 188. The input data bus 188 includes four external slots 211.

Based on the slot address 176 provided from the slot address processing unit 130, the Write data processing unit 140 allocates Write data received from the input data bus 188, to slots of the internal memory write buses 186.

Each of the internal memory write buses 186 includes four internal slots 210. The Write data processing unit 140 allocates each piece of Write data received from the four external slots 211 of the input data bus 188, to a corresponding internal slot 210 of each of the four internal memory write buses 186, thereby writing the pieces of Write data into the four memory modules 180.

More specifically, the Write data processing unit 140 provides pieces of data received via external slots 211 to internal slots 210. Here, each of the external slots 211 is at a position designated by a corresponding external slot address 201. Each of the internal slots is included in an internal memory write bus 186 designated by an upper slot address 203 associated with the external slot address 201, and is located at a position designated by a lower slot address 204 associated with the external slot address 201.

The Write data processing unit 140 provides each of pieces of data received via the external slots 211 designated by the four external slot addresses 201 included in the slot address 176, to a corresponding internal slot 210.

In addition, the Write data processing unit 140 divides total m-bit Write data provided via the input data bus 188 into pieces based on the slot address 176, and then copies and outputs the divided pieces of data to be carried via all of the internal memory write buses 186. Here, the Write data processing unit 140 sets a data mask flags to any internal slot 201 which is not used in the data writing, and provides the flag to a corresponding internal memory write bus 186. The data mask flag is a flag for instructing not to write data into the corresponding memory module 180 via the internal slot 210 assigned with the data mask flag.

In other words, the Write data processing unit 140 assigns data mask flags to internal slots 210, except internal slots 210 via which pieces of data received via the external slots 211 are written to the memory modules 180.

More specifically, the Write data processing unit 140 allocates a piece of data received via an external slot 211 at a position designated by an external slot address 201, to an internal slot 210 at a position designated by an lower slot address 204 associated with the external slot address 201. Based on the slot address 176, the Write data processing unit 140 generates a piece of total m-bit data, by allocating pieces of data received via the four external slot addresses 201 to the four internal slots 210.

For each of the internal memory write buses 186 that is designated by a corresponding upper slot address 203, the Write data processing unit 140 assigns a data mask flag to internal slots 210 except the internal slot 210 designated by the lower slot address 204 associated with the upper slot address 203.

As described above, based on the slot address 176, the Write data processing unit 140 can receive pieces of data in a total m-bit Write data from the four external slots, and write the pieces of data into the four memory modules 180 separately.

Next, data reading performed by the group memory module 100 is described.

Figure 4:
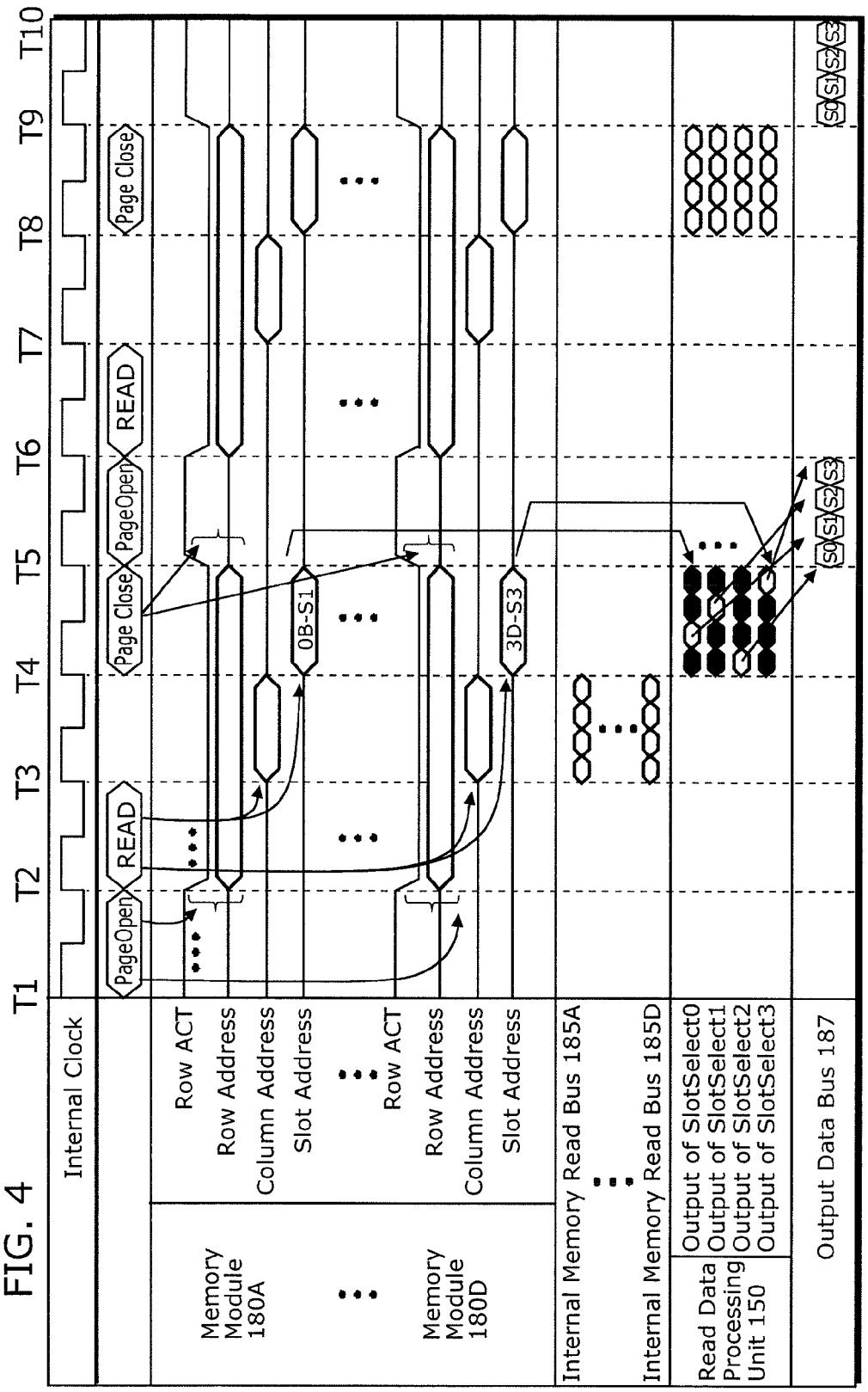
FIG. 4 is a time chart of data reading performed by a group memory module according to the first embodiment of the present invention.

FIG. 4 is a time chart of data reading performed by the group memory module 100.

In a cycle (time period) T1 of the internal clock, the row address processing unit 110 receives a row address command including the row address 175 and the activation signal from the command I/F 170. In a cycle T2 of the internal clock, the row address processing unit 110 issues row addresses 178 and the activation signal (row ACT), which are obtained from the received row address command, to the four memory modules 180 simultaneously. Here, in FIG. 4, a low row ACT is a signal representing an activated state, while a high row ACT is a signal representing a deactivated state.

Thereby, memory elements in a row designated by a corresponding row address 178 are activated. The row address processing unit 110 holds the row addresses 178 and the activation signal until a deactivation command is received from the command I/F 170. For example, the row address processing unit 110 holds the row addresses 178 and the activation signal until the end of a cycle T4.

Further, in the cycle T2, the column address processing unit 120 receives a column address command including the column address 174 and a Read instruction signal from the command I/F 170. In a cycle T3, the column address processing unit 120 issues column addresses 177 and the Read instruction signal simultaneously to the four memory modules 180 that have been activated since the cycle T2. Thereby, each of the memory modules 180 provides data stored in a memory element in a column designated by a corresponding column address 177 from among the activated memory elements designated by the corresponding row address 178, to the internal memory read bus 185 connected to the memory module 180.

During supply of the corresponding column address 177 and the Read instruction signal, each of the memory modules 180 is providing data to the corresponding internal memory read bus 185. For example, the column address processing unit 120 holds the column addresses 177 and the Read instruction signal until the end of the cycle T4.

In the cycle T4, the Read data processing unit 150 retrieves pieces of Read data provided in the cycle T3 via the respective internal memory read buses 185, and provides the retrieved data into a data holding circuit (not shown) included in the Read data processing unit 150.

Furthermore, in the cycle T2, the slot address processing unit 130 receives a slot address command including the slot address 176 from the command I/F 170, in synchronization with the receipt of the column address command. The slot address processing unit 130 holds the received slot address command until the end of the cycle T4. In the cycle T4, the slot address processing unit 130 issues the internal slot addresses 202 and the external slot addresses 201 simultaneously to the Read data processing unit 150.

Based on the external slot addresses 201 received in the cycle T4, the Read data processing unit 150 selects, for each of the external slots 211, one of the internal memory read buses 185 which is designated by an upper slot address 203 included in the slot address 202 received in the cycle T4. Then, the Read data processing unit 150 selects, for each of the external slots 211, a piece of data received via an internal slot 210 in the selected internal memory read bus 185, based on a lower slot addresses 204 included in the internal slot address 202. In a cycle T5, the Read data processing unit 150 allocates pieces of Read data provided from total four internal slots 210, into the respective four external slots 211. Thereby, the Read data processing unit 150 provides the pieces of Read data to the data input-output I/F 160 via the four external slots 211.

Here, it is assumed that the slot address 176 has four sets of an internal slot address 202 and an external slot address 201, which are "0B-S1", "1C-S2", "2A-S0", and "3D-S3". Under the assumption, the following is performed. Data provided from the first internal slot 210 of the internal memory read bus 185B is allocated as a piece of Read data to the second external slot 211. Data provided from the second internal slot 210 of the internal memory read bus 185C is allocated as a piece of Read data to the third external slot 211. Data provided from the third internal slot 210 of the internal memory read bus 185A is allocated as a piece of Read data to the first external slot 211. Data provided from the final internal slot 210 of the internal memory read bus 185D is allocated as a piece of Read data to the final external slot 211.

In the cycle T5, the row address processing unit 110 receives the deactivation command from the command I/F 170. The row address processing unit 110 changes the row address 178 and the activation signal for each of the activated memory modules 180 to be in a deactivated state.

As described above, the group memory module 100 simultaneously activates irrelevant row addresses of the four memory modules 180. Then, the group memory module 100 simultaneously issues the column addresses 177 and the Read instruction command to the respective four memory modules 180. Thereby, sheer independent four pieces of data are provided to the respective internal memory read buses 185 each having a data width of m bits.

Moreover, the Read data processing unit 150 selects an internal slot 210 of each of the internal memory read buses 185 based on designation of an internal slot address 202. Then, the Read data processing unit 150 provides pieces of Read data received from such selected internal slots 210, to the respective four external slots 211 independently. Thereby, the pieces of Read data are provided to the data input-output I/F 160 in units of m/4 bits. The pieces of Read data are independent from and not irrelevant to one another. In the manner as described above, the memory device 10 according to the first embodiment of the present invention can reduce an effective data unit (hereinafter, referred to as the "minimum access unit") to m/4 bits, while a bus width still has m bits.

Next, data writing performed by the group memory module 100 is described.

Figure 5:
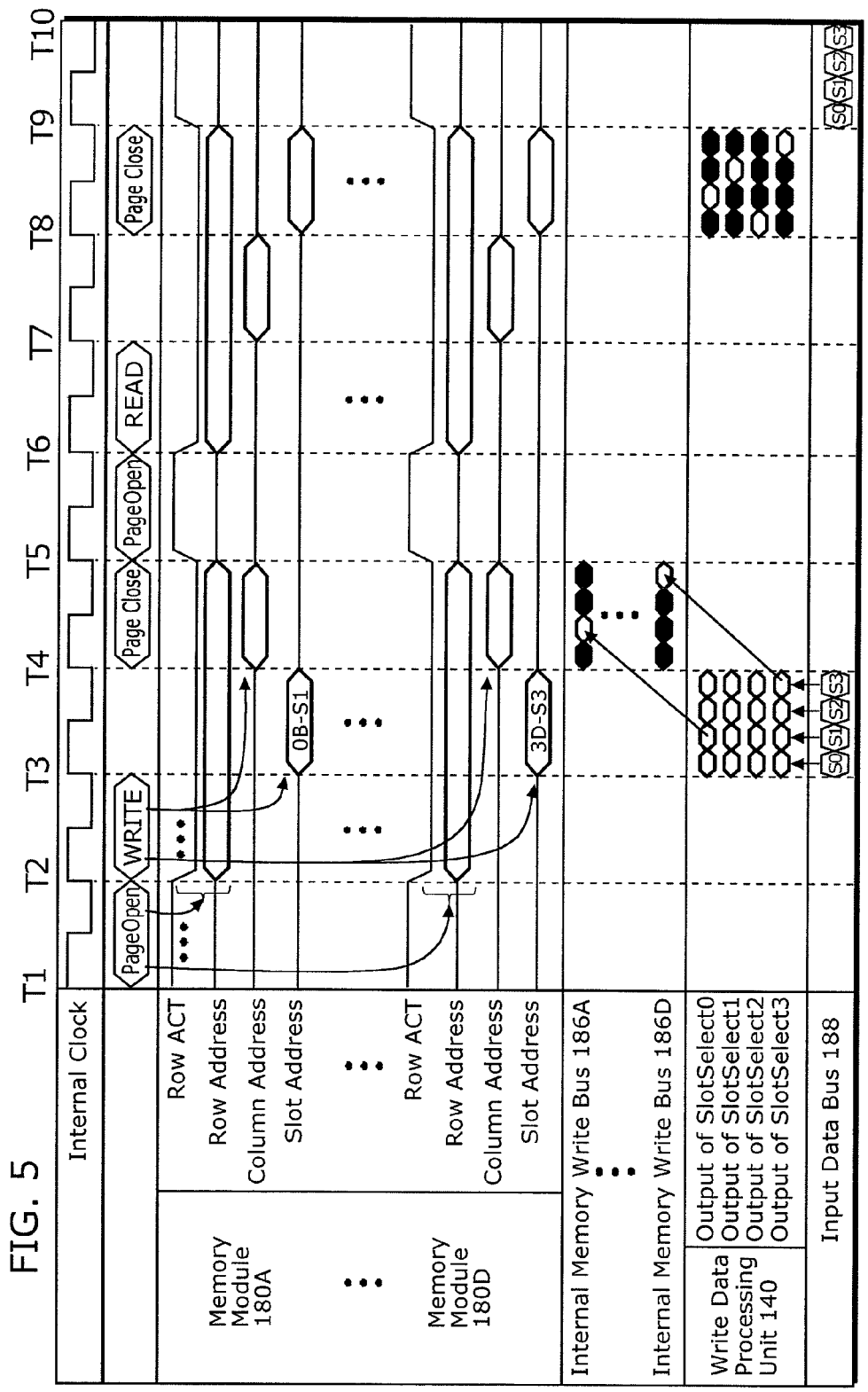
FIG. 5 is a time chart of data writing performed by the group memory module according to the first embodiment of the present invention.

FIG. 5 is a time chart of data writing performed by the group memory module 100.

The identical processes in the data reading in FIG. 4 are not explained again for the data writing.

Like the data reading, in the cycle T2, a memory element in each of the memory modules 180 which is designated by a corresponding row address 178 is activated.

In the cycle T3, the Write data processing unit 140 retrieves pieces of Write data provided via the data input-output I/F 160, and provides the retrieved data into a data holding circuit (not shown) included in the Write data processing unit 140. The Write data processing unit 140 passes the retrieved pieces of Write data to an output circuit (not shown). The output circuit is included in the Write data processing unit 140 to provide the pieces of Write data to the internal memory write buses 186.

In the cycle T3, the slot address processing unit 130 simultaneously issues the internal slot addresses 202 and the external slot addresses 201 to the Write data processing unit 140.

The Write data processing unit 140 generates data mask flags to distinguish pieces of data to be written to the memory modules 180 from pieces of data not to be written to the memory modules 180. In the cycle T4, the Write data processing unit 140 outputs the generated data mask flags together with the pieces of Write data.

In more detail, based on upper slot addresses 203 included in internal slot addresses 202 received in the cycle T3 from the slot address processing unit 130, the Write data processing unit 140 selects internal memory write buses 186 connected to the memory modules 180 to which pieces of Write data to be written. The Write data processing unit 140 selects internal slots 210 from the selected internal memory write buses 186, based on lower slot addresses 202 included in the internal slot addresses 202, and enables the selected internal slots 210. The Write data processing unit 140 sets data mask flags to the other internal slots 210 which are not enabled.

In the cycle T4, the Write data processing unit 140 outputs the pieces of Write data and the data mask flags generated in the cycle T3.

On the other hand, in the cycle T2, the column address processing unit 120 receives the column address command including the column address 174 and a Write instruction signal from the command I/F 170. In the cycle T4, the column address processing unit 120 issues a corresponding column address 177 and the Write instruction signal to each of the four memory modules having been activated since the cycle T2. Thereby, each of the memory modules 180 stores a piece of data received from the corresponding internal memory write bus 186, into a memory element that is designated by the corresponding column address 177 from among activated memory elements designated by the corresponding row address 178. Here, while the column addresses 177 and the Write instruction signal are being supplied to the respective memory modules 180, the Write data processing unit 140 is providing the pieces of Write data to the internal memory write buses 186. For example, the Write data processing unit 140 is outputting the pieces of Write data until the end of the cycle T4.

In the cycle T5, the row address processing unit 110 changes the row addresses 178 and the activation signal of the memory modules 180 activated in the cycle T2 to be in a deactivated state.

As described above, the group memory module 100 selects an internal memory write bus 186 for each of the external slots 211. A piece of Write data received from the external slot is provided to the selected internal memory bus 186. Here, the group memory module 100 also outputs data mask flags based on the corresponding internal slot address 202. The data mask flags are assigned to internal slots 210 which are not used in the data writing. Thereby, the group memory module 100 can (i) receive pieces of data from the data input-output I/F 160 via a bus having a width of m bits, and (ii) store, in units of m/4 bits, each of the pieces of data into a desired position designated by a corresponding row address 178 and column address 177 of a memory element in a desired memory module 180. Therefore, in the data writing, the group memory module 100 can reduce the minimum access unit to m/4 bits, while an input bus has still a bus width of m bits.

Next, successive data reading performed by the group memory module 100 is described.

Figure 6:
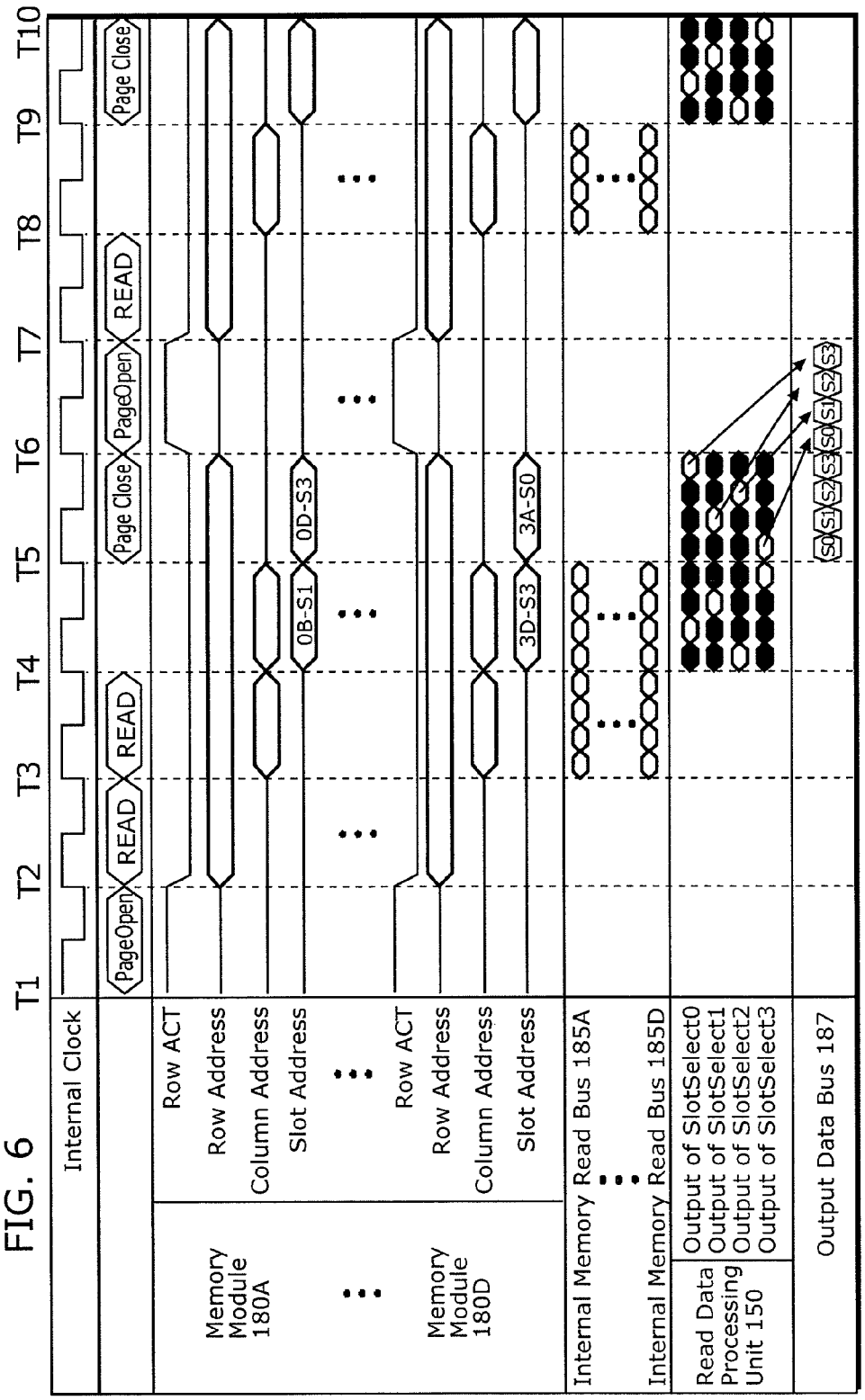
FIG. 6 is a time chart of successive data reading performed by the group memory module according to the first embodiment of the present invention.

FIG. 6 is a time chart of data reading performed by the group memory module 100.

The identical processes in the data reading in FIG. 4 are not explained again for the below data reading.

Like the data reading shown in FIG. 4, in a cycle T2, a memory element in each of the memory modules 180 which is designated by a corresponding row address 178 is activated.

In the cycle T2, the column address processing unit 120 receives the first column address command from the command I/F 170. In a cycle T3, the column address processing unit 120 simultaneously issues column addresses 177 and a Read instruction signal in the first column address command to the four memory modules 180 that have being activated since the cycle T2.

In the cycle T3, the column address processing unit 120 further receives the second column address command from the command I/F 170. In a cycle T4, the column address processing unit 120 simultaneously issues column addresses 177 and a Read instruction signal in the second column address command to the four memory modules 180 that have been activated since the cycle T2.

In receiving the corresponding column address 177 and the Read instruction signal in the first column address command, each of the memory modules 180 provides the first Read data to a corresponding one of the internal memory read buses 185 in the cycle T3. In receiving the corresponding column address 177 and the Read instruction signal in the second column address command, each of the memory modules 180 provides the second Read data to the corresponding one of the internal memory read buses 185 in the cycle T4.

It should be noted that it has been described that a Read command is issued twice, but the same processing can be achieved by issuing the Read commands twice or more. Even if the Read command is issued twice or more, data provided to each of the internal memory read buses 185 is switched to another in units of cycles (time periods) of the internal clock.

With the first rising edge of the cycle T4, the Read data processing unit 150 retrieves pieces of the first Read data read via the respective internal memory read buses 185, and provides the retrieved data into the data holding circuit. The Read data processing unit 150 performs operation to provide the retrieved pieces of first Read data to the data input-output I/F 160. Next, with the first rising edge of the cycle T5, the Read data processing unit 150 retrieves pieces of the second Read data read via the respective internal memory read buses 185, and provides the retrieved data into the data holding circuit. The Read data processing unit 150 performs operation to provide the retrieved pieces of second Read data to the data input-output I/F 160.

Furthermore, in the cycle T2, the slot address processing unit 130 receives the first slot address command from the command I/F 170, in synchronization with receipt of the first column address command by the column address processing unit 120. The slot address processing unit 130 holds the received first slot address command until the end of the cycle T4. In the cycle T4, the slot address processing unit 130 simultaneously issues the internal slot addresses 202 and the external slot addresses 201 included in the held first slot address command, to the Read data processing unit 150.

In the cycle T3, the slot address processing unit 130 receives the second slot address command from the command I/F 170. The slot address processing unit 130 holds the received second slot address command until the end of a cycle T5. In the cycle T5, the slot address processing unit 130 simultaneously issues the internal slot addresses 202 and the external slot addresses 201 included in the held second slot address command, to the Read data processing unit 150.

It should be noted that the data holding circuit in the Read data processing unit 150 may have a plurality of stages, or may be implemented as a Fast in Fast out (FiFo) buffer, for example.

Based on the first external slot addresses 201 received in the cycle T4, the Read data processing unit 150 selects, for each of the external slots 211, one of the internal memory read buses 185 which is designated by an upper slot address 203 included in the internal slot address 202 of the first slot address which is received in the cycle T4. Then, the Read data processing unit 150 selects data received via an internal slot 210 of the selected internal memory read bus 185, based on a lower slot addresses 204 included in the internal slot address 202. In the cycle T5, the Read data processing unit 150 allocates pieces of first Read data provided from total four selected internal slots 210, into the respective four external slots 211. Then, the Read data processing unit 150 provides the pieces of first Read data to the data input-output I/F 160 via the four external slots 211.

Based on the second external slot addresses 201 received in the cycle T5, the Read data processing unit 150 selects, for each of the external slots 211, one of the internal memory read buses 185 which is designated by an upper slot address 203 included in the internal slot address 202 of the second slot address which is received in the cycle T5. Then, the Read data processing unit 150 selects data received via an internal slot 210 of the selected internal memory read bus 185, based on a lower slot addresses 204 included in the internal slot address 202. In a cycle T6, the Read data processing unit 150 allocates pieces of second Read data provided from total four selected internal slots 210, into the respective four external slots 211. Then, the Read data processing unit 150 provides the pieces of second Read data to the data input-output I/F 160 via the four external slots 211.

Here, the internal slot addresses 202 and the external slot addresses 201 of the first slot address command which are received by the Read data processing unit 150 in the cycle T4 may be different from or the same as the internal slot addresses 202 and the external slot addresses 201 of the second slot address command which are received by the Read data processing unit 150 in the cycle T5 by the Read data processing unit 150. In other words, the group memory module 100 can select desired slots based on the first and second slot addresses 176 which are designated from the outside.

As described above, the memory device 10 can output Read data in each cycle, keeping a m-bit bus width for an output of the data input-output I/F 160 and reducing the effective data unit to m/4 bits.

It should be noted that the above has described successive reading operation, but the memory device 10 can also perform successive writing operation. The successive writing operation is pipeline operation by which an input timing of a Write command and Write data in the second writing operation is delayed by one cycle from an input timing of a Write command and Write data in the first writing operation.

As described above, in the memory device 10 according to the first embodiment of the present invention, a single input-output operation can access pieces of data having a plurality of different addresses, without changing a transfer size of Read data and a transfer size of Write data. Thereby, the memory device 10 according to the first embodiment of the present invention can reduce a minimum access unit for data. As a result, high access efficiency can be achieved. In addition, the memory device 10 according to the first embodiment of the present invention can achieve the high access efficiency, without increasing the number of embedded memory modules like conventional memory devices do. As a result, the memory device 10 according to the first embodiment of the present invention can achieve both of high access efficiency and suppression of cost increase.

Second Embodiment

A memory device according to a second embodiment of the present invention has two group memory modules each of which is the same as the group memory module 100 described in the first embodiment.

First, a structure of the memory device according to the second embodiment of the present invention is described.

Figure 7:
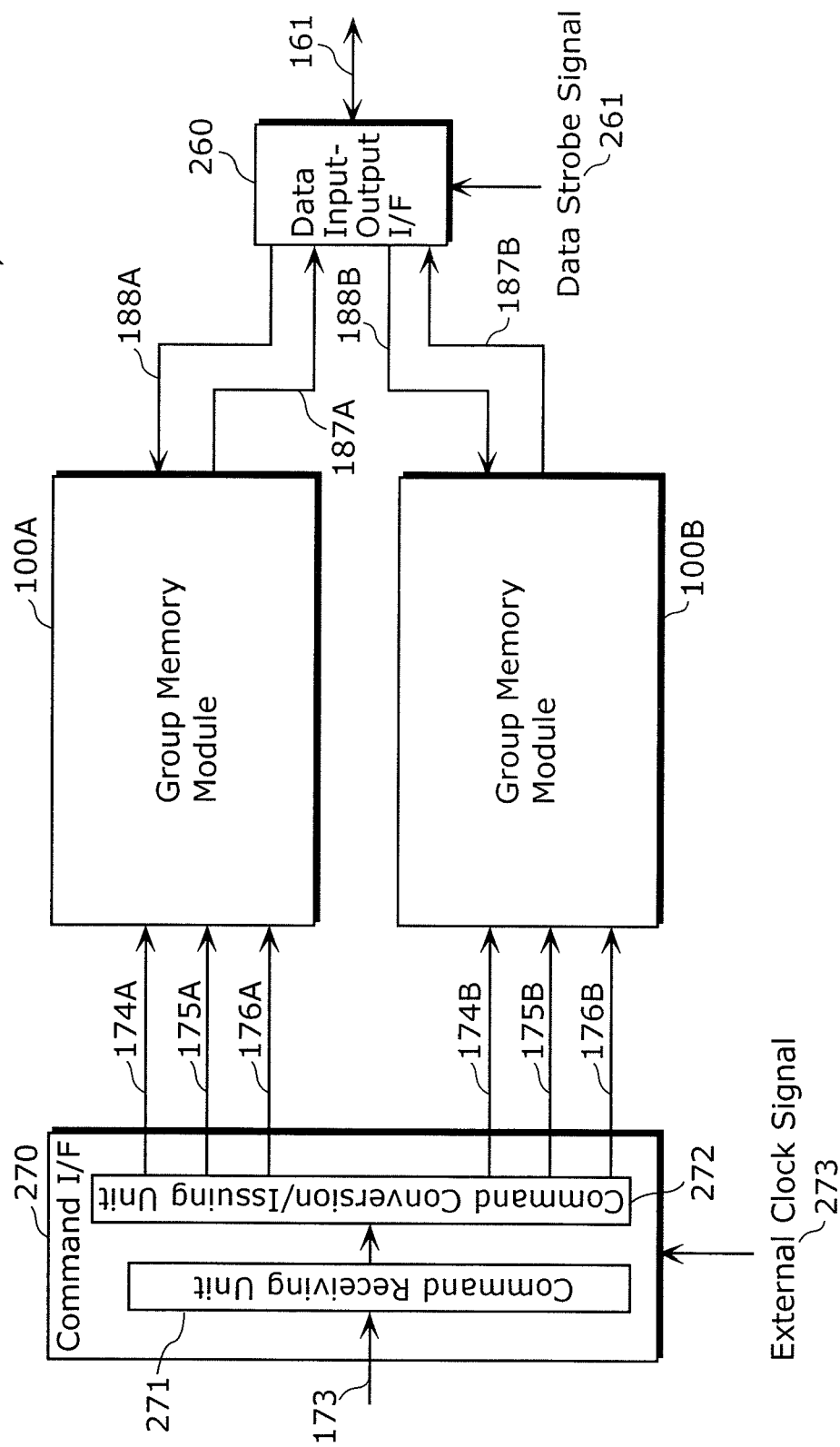
FIG. 7 is a block diagram showing a structure of a memory device according to a second embodiment of the present invention.

FIG. 7 is a block diagram showing a structure of the memory device according to the second embodiment of the present invention. Here, the same reference numerals of FIG. 1 are assigned to the identical units of FIG. 7, so that the identical units are not explained again below.

A memory device 20 shown in FIG. 7 includes group memory modules 100A and 100B, a data input-output I/F 260, and a command I/F 270.

Each of the group memory modules 100A and 100B has the same structure as that of the group memory module 100 shown in FIG. 1.

The command I/F 270 includes a command receiving unit 271 and a command conversion/issuing unit 272.

The command receiving unit 271 receives external commands regarding the group memory modules 100A and 100B from the external command bus 173.

The command conversion/issuing unit 272 converts the external address included in the external command regarding the group memory module 100A received by the command receiving unit 271, into internal addresses of the group memory module 100A, such as a column address 174A, a row address 175A, and a slot address 176A. The command conversion/issuing unit 272 provides the column address 174A to the column address processing unit 120, the row address 175A to the row address processing unit 110, and the slot address 176A to the slot address processing unit 130 in the group memory module 100A.

On the other hand, the command conversion/issuing unit 272 converts the external address included in the external command regarding the group memory module 100B received by the command receiving unit 271, into internal addresses of the group memory module 100B, such as a column address 174B, a row address 175B, and a slot address 176B. The command conversion/issuing unit 272 provides the column address 174B to the column address processing unit 120, the row address 175B to the row address processing unit 110, and the slot address 176B to the slot address processing unit 130 in the group memory module 100B.

The data input-output I/F 260 converts pieces of Read data received from the group memory module 100A via an output data bus 187A in order to correspond to a bus width of the external data bus 161, and then provides the converted Read data to the external data bus 161

In addition, the data input-output I/F 260 converts pieces of Read data received from the group memory module 100B via an output data bus 187B in order to correspond to the bus width of the external data bus 161, and then provides the converted Read data to the external data bus 161.

The data input-output I/F 260 converts Write data received from the external data bus 161, which corresponds to the bus width of the external data bus 161, in order to correspond to a bus width of m bits. Then, the data input-output I/F 260 provides the converted Write data to input data buses 188A and 188B.

Each of the output data buses 187A and 187B and the input data buses 188A and 188B has a bus width of m bits.

Next, operation performed by the memory device 20 is described.

Figure 8:
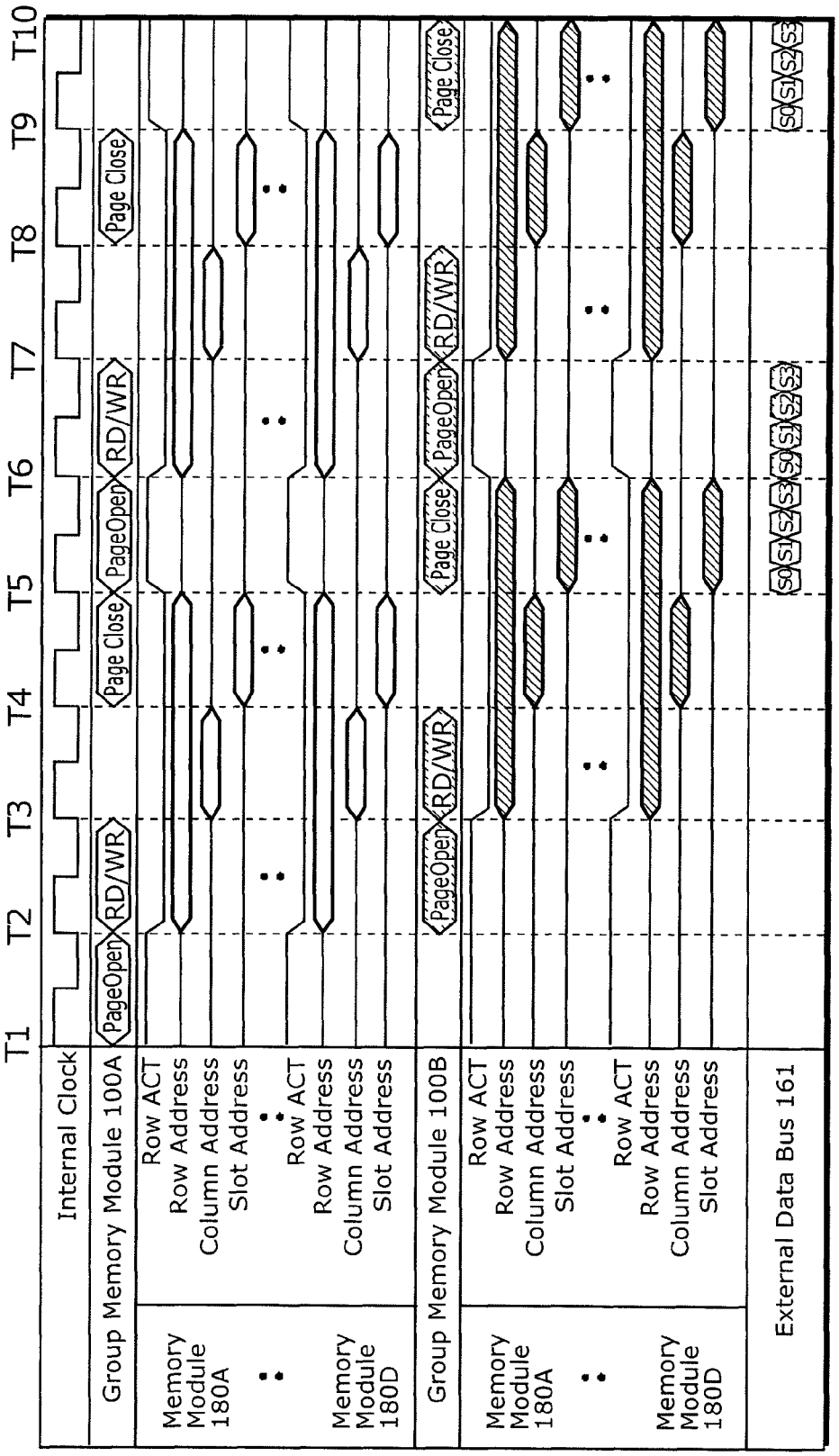
FIG. 8 is a time chart of data reading performed by a group memory module according to the second embodiment of the present invention.

FIG. 8 is a time chart of data reading performed by the memory device 20.

The operation of reading data from the two group memory modules is described below.

In a cycle T1, the group memory module 100A receives a row address 175A and an activation signal from the command I/F 270. In a cycle T2, the group memory module 100A simultaneously activates the four memory modules 180.

On the other hand, in the cycle T2, the group memory module 100B receives a row address 175B and an activation signal from the command I/F 270. In a cycle T3, the group memory module 100B simultaneously activates the four memory modules 180.

In the cycle T2, the group memory module 100A receives a column address 174A and a slot address 176A from the command I/F 270. In the cycle T3, the group memory module 100A issues a corresponding column address 177 to each of the memory modules 180. In a cycle T4, the Read data processing unit 150 in the group memory module 100A retrieves pieces of data provided via the internal memory read buses 185, and provides the retrieved data into the data holding circuit.

On the other hand, in the cycle T3, the group memory module 100B receives a column address 174B and a slot address 176B from the command I/F 270. In the cycle T4, the group memory module 100B issues a corresponding column address 177 to each of the memory modules 180. In the cycle T5, the Read data processing unit 150 in the group memory module 100B retrieves pieces of data provided via the internal memory read buses 185, and provides the retrieved data into the data holding circuit.

In the cycle T5, based on the slot address 176A, the group memory module 100A allocates pieces of data carried via the internal slots 210 to the external slots 211, and provides the allocated pieces of data to the data input-output I/F 260 via the external slots 211.

On the other hand, in the cycle T6, based on the slot address 176B, the group memory module 100B allocates pieces of data carried via the internal slots 210 to the external slots 211, and provides the allocated pieces of data to the data input-output I/F 260 via the external slots 211.

As described above, the memory device 20 controls the group memory modules 100A and 100B in the same manner as described for the group memory module 100 according to the first embodiment. In the memory device 20, the command I/F 270 delays issue of one of commands to the group memory modules 100A and 100B from issue of the other by one cycle. Thereby, an inaccessible period of one of the group memory modules 100A and 100B can be used as an accessible period of the other. As a result, the memory device 20 can increase efficiency of the external data bus 161.

It should be noted that it has been described that the memory device 20 has the two group memory modules 100A and 100B, but the group memory modules may be two or more.

The command receipt of the command I/F 270 and Read data output of the data input-output I/F 260 can be performed by employing the methods described below.

Figure 9A:
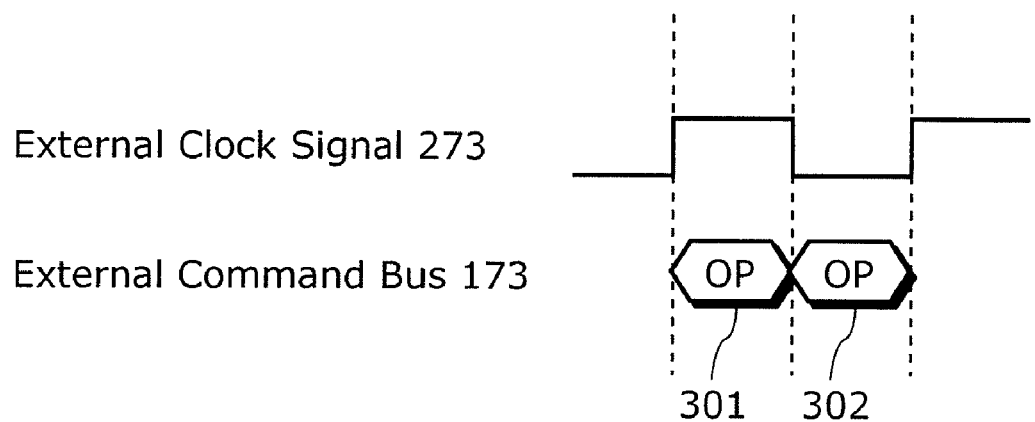
FIG. 9A is a diagram of command-receiving performed by a command I/F according to the second embodiment of the present invention.
Figure 9B:
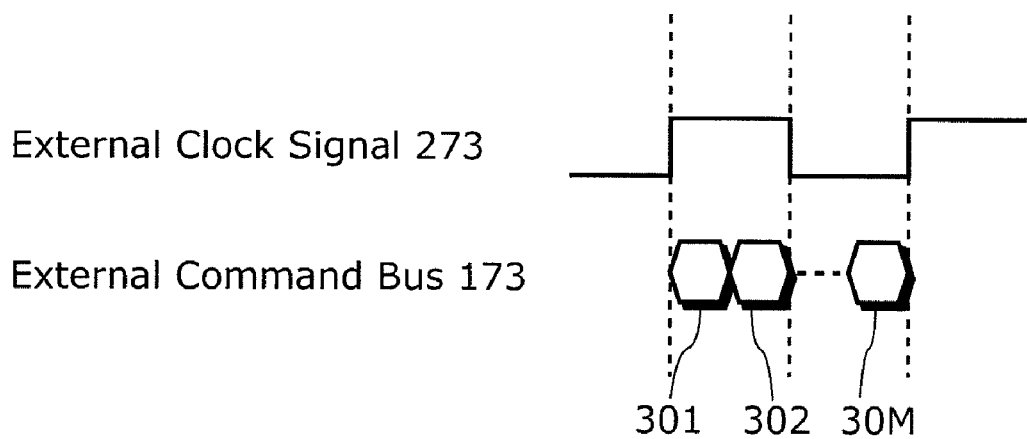
FIG. 9B is a diagram of command-receiving performed by the command I/F according to the second embodiment of the present invention.

FIGS. 9A and 9B are time charts of command receiving methods employed by the command I/F 270.

The command I/F 270 may employ any one of: the command receiving method shown in FIG. 9A (hereinafter, referred to as a "method X"); and the command receiving method shown in FIG. 9B (hereinafter, referred to as a "method Y").

The method X is a method by which the command I/F 270 receives two external commands 301 and 302 in one access cycle of an external clock signal 273. The external clock signal 273 is a synchronizing signal supplied from the outside of the memory device 20. By the method X, the command I/F 270 receives external commands corresponding to M group memory modules in M/2 cycle.

It should be noted that the command I/F 270 may use, instead of the external clock signal 273, a timing signal that varies depending on timing changes of the external clock signal 273.

The method Y is a method by which the command I/F 270 receives M external commands 301 to 30M in one access cycle of the external clock signal 273. By the method Y, the command I/F 270 receives external commands corresponding to M group memory modules in one cycle.

Figure 10A:
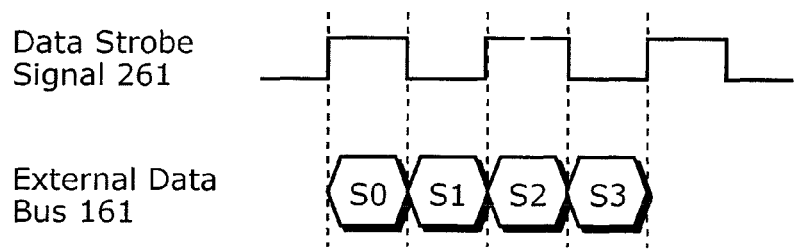
FIG. 10A is a diagram of data input-output performed by a data input-output I/F according to the second embodiment of the present invention.
Figure 10B:
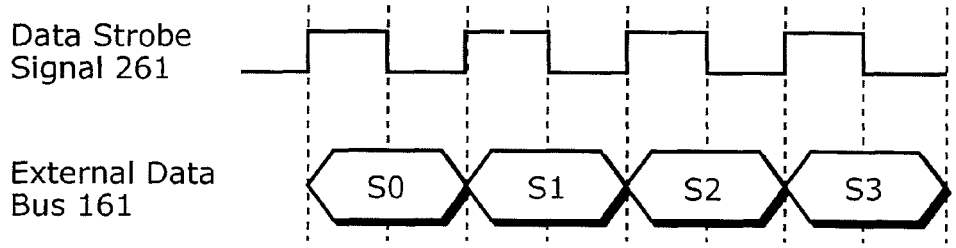
FIG. 10B is a diagram of data input-output performed by the data input-output I/F according to the second embodiment of the present invention.

FIGS. 10A and 10B are diagrams showing data input-output operations performed by the data input-output I/F.

The data input-output I/F 260 may use any one of: the data input-output method shown in FIG. 10A (hereinafter, referred to as a "method P"); and the data input-output method shown in FIG. 10B (hereinafter, referred to as a "method Q").

The method P is a method by which the data input-output I/F 260 inputs or outputs two pieces of data each corresponding to a bus width of the external data bus in one access cycle of a data strobe signal 261. In other words, in one cycle of the data strobe signal 261, the data input-output I/F 260 receives two pieces of data each being supplied via the external data bus 161 and each having a bus width of the external data bus 161. In one cycle of the data strobe signal 261, the data input-output I/F 260 provides two pieces of Read data each of which has been converted to correspond to a bus width of the external data bus 161, to the external data bus 161.

The data strobe signal 261 is a synchronizing signal supplied from the outside of the memory device 20. Here, the data input-output I/F 260 may use, instead of data strobe signal 261, a timing signal that varies depending on timing changes of the data strobe signal 261.

By the method P, the data input-output I/F 260 exchanges M pieces of Read data or M pieces of Write data with the external data bus 161 in M/2 cycle.

The method Q is a method by which the data input-output I/F 260 inputs or outputs a piece of data corresponding to a bus width of the external data bus in one access cycle of the data strobe signal 261. By the method Q, the data input-output I/F 260 exchanges M pieces of Read data or M pieces of Write data with the external data bus 161 in M cycles.

FIG. 11 is a table showing a bandwidth, a minimum access granularity (minimum access unit), an external clock frequency, an internal clock frequency, an external data bus frequency, and an external data bus width, regarding each of a conventional technique and the techniques according to the second embodiment which are combinations of the above method X, method Y, method P, and method Q.

The conventional technique is DDR2-800 compliant to a data bus width of 4 bytes. The external clock frequency refers to a frequency of the external clock signal 273, and the external data bus frequency refers to a frequency of the data strobe signal 261.

As shown in FIG. 11, in each of the conventional technique and the techniques according to the second embodiment, a bandwidth is the same 3200 MByte/s and an external clock frequency is the same 400 MHz.

The combination of the methods X and P can reduce the minimum access unit, without changing the internal clock frequency and the external clock frequency and without decreasing the data bus width.

The combination of the methods X and Q can increase the external data bus to ensure a memory band, and also decrease the internal clock frequency. As a result, power consumption of the memory device 20 can be reduced.

The combination of the methods Y and P can reduce the minimum access unit, without changing the internal clock frequency and the external clock frequency and without decreasing the data bus width. Moreover, this combination can reduce deterioration of data transfer efficiency caused by an inoperative time period of the external data bus 161. The inoperative time period occurs when two or more commands are issued for the group memory modules 100A and 100B in the same cycle, and one of them is issued first and the others are delayed.

The combination of the methods Y and Q can decrease the internal clock frequency and the external data bus frequency, without reducing a data memory band. As a result, power consumption of the memory device 20 can be reduced. In addition, this combination can reduce deterioration of data transfer efficiency caused by an inoperative time period of the external data bus 161.

The above has described the memory devices 10 and 20 according to the embodiments of the present invention. However, the present invention is not limited to the above embodiments.

For example, although it has been described in the second embodiment of the present invention that the memory device 20 includes the single data input-output I/F 260, the memory device 20 may have the following structure.

FIG. 12 is a block diagram showing a structure of a memory device according to a variation of the second embodiment of the present invention.

A memory device 30 shown in FIG. 12 differs from the memory device 20 shown in FIG. 7 in replacing the data input-output I/F 160 by two data input-output I/Fs 160A and 160B.

The data input-output I/F 160A converts m-bit Read data received via the output data bus 187A to correspond to the bus width of the external data bus 161. Then, the data input-output I/F 160A provides the converted Read data to the external data bus 161. The data input-output I/F 160A also converts Write data supplied via the external data bus 161, which corresponds to the bus width of the external data bus 161, in order to correspond to a bus width of m bits, and then provides the converted Write data to the input data bus 188A.

The data input-output I/F 160B converts m-bit Read data received via the output data bus 187B to correspond to the bus width of an external data bus 162, and provides the converted Read data to the external data bus 162. The data input-output I/F 160B also converts Write data supplied via the external data bus 162, which corresponds to the bus width of the external data bus 162, in order to correspond to a bus width of m bits, and then provides the converted Write data to the input data bus 188B.

Furthermore, the receiving methods of FIGS. 9A and 9B employed by the command I/F 270 may be employed by the previously-described command I/F 170 according to the first embodiment. In this case, the command I/F 170 may receive a plurality of external commands for the memory modules 180 in one cycle of the external clock signal 273. In other words, in one cycle of the external clock signal 273, the command I/F 170 may receive two or more external commands, or receive commands corresponding to the number of the memory modules 180.

It is also possible that the command I/F 270 receives commands corresponding to the number of the group memory modules 100A and 100B in one cycle of the external clock signal 273. It is further possible that the command I/F 270 receives commands corresponding to a total number of the memory modules 180 included in the group memory modules 100A and 100B in one cycle of the external clock signal 273.

The command I/F 270 may have a function of simultaneously issuing commands to the group memory modules 100A and 100B or to the memory modules 180 in the group memory modules 100A and 100B. In addition, the command I/F 270 may receive, in one access cycle, external commands corresponding to the number of the group memory modules, or a total number of the memory modules 180 in the group memory modules.

It should be noted that it has been described above that the command I/F 270 receives a plurality of external commands by time-sharing, but the external commands may be transferred to the command I/F 270 by dividing a bus width of the external command bus 173.

It should also be noted that it has been described above that the data input-output I/F 260 exchanges pieces of data with the external data bus 161 by time-sharing, but the pieces of data may be exchanged by dividing a bus width of the external data bus 161.

It should also be noted that the row address 178 may be a page address of a memory cell 181.

It should also be noted that bits for designating a memory module 180 and bits for designating a slot may be at any desired positions in the internal slot address 202. For example, it is also possible that lower two bits represent a memory module and upper two bits represent a slot.

It should also be noted that the number of the memory modules 180 included in each of the group memory modules 100, 100A, and 100B is not limited to four, but the number may be any desired number more than 2.

It should also be noted that it has been described that one internal slot is selected from the four internal slots 210 included in each of the internal memory read buses 185 or each of the internal memory write buses 186. However, it is also possible to select two or more internal slots from the four internal slots 210 included in a certain internal memory read bus 185 or a certain internal memory write bus 186, and select none from the other internal memory read buses 185 or the other internal memory write buses 186.

It should also be noted that it has been described that a bus width of each of the internal memory read buses 185 and the internal memory write buses 186 is equal to a bus width of each of the output data bus 187 and the input data bus 188. However, it may be not so. In other words, it is also possible that the number of the internal slots 210 included in each of the internal memory read buses 185 and the internal memory write buses 186 may be different from the number of the external slots 211 included in each of the output data bus 187 and the input data bus 188.

In addition, it has been described that each of (a) the number of the internal slots 210 included in each of the internal memory read buses 185 and the internal memory write buses 186 and (b) the number of the external slots 211 included in the output data bus 187 and the input data bus 188 is equal to the number of the memory modules 180. However, each of the numbers may be different from the number of the memory modules 180.

As described above, it is preferable that the bus width of each of the internal memory read buses 185 and the internal memory write buses 186 is equal to the bus width of each of the output data bus 187 and the input data bus 188, and that each of (a) the number of the internal slots 210 included in each of the internal memory read buses 185 and the internal memory write buses 186 and (b) the number of the external slots 211 included in each of the output data bus 187 and the input data bus 188 is equal to the number of the memory modules 180. This allows the above-described memory device to have a relatively simple structure and efficiently reduce a minimum access unit.

INDUSTRIAL APPLICABILITY

The present invention can be used as a memory device or a control method of controlling the memory device. Especially, the present invention can be used as a memory device having a plurality of DRAMs and the like.

The invention claimed is:

1. A memory device from and to which data corresponding to a first size can be read and written, said memory device comprising:
an address holding unit configured to hold N addresses where N is an integer of 2 or more;
N read buses and N write buses, each of said N read buses and said N write buses having a bus width of a second size and including first slots, each of the first slots being a partial bus having a bus width of a third size;
N memory modules each uniquely connected to a corresponding one of said N read buses and a corresponding one of said N write buses, each of said N memory modules holding data for each address designated by a corresponding one of the N addresses held in said address holding unit;
an output data bus and an input data bus each having a bus width of the first size and including second slots, each of the second slots being a partial bus having a bus width of the third size;
a read data processing unit configured to (i) select, from among pieces of data read from said N memory modules via said N read buses, pieces of data read via two or more first slots from among the first slots included in said N read buses, and (ii) provide the selected pieces of data to second slots from among the second slots included in said output data bus; and
a write data processing unit configured to provide each of pieces of data provided via the second slots included in said input data bus, to a corresponding one of the first slots included in said N write buses, so as to write the pieces of data provided via the second slots included in said input data bus to said N memory modules.

2. The memory device according to claim 1, further comprising
a slot address processing unit configured to obtain a slot address indicating a one-to-one relationship between a first position of one of the first slots and a second position of one of the second slots,
wherein said read data processing unit is configured to (i) select a piece of data read via the one of the first slots at the first position indicated by the slot address, from among pieces of data read via the first slots included in said N read buses, and (ii) provide the selected piece of data read via the one of the first slots at the first position indicated by the slot address to the one of the second slots at the second position associated with the first position, and
said write data processing unit is configured to provide a piece of data provided via the one of the second slots included in said input data bus, to the one of the first slots at the first position associated with the second position of the one of the second slots indicated in the slot address.

3. The memory device according to claim 2,
wherein the slot address includes second slot addresses and first slot addresses, the second slot addresses each designating a second position of a corresponding one of the second slots, and the first slot addresses each designating a first position of the first slots each associated with a corresponding one of the second slots,
each of the first slot addresses includes a first address and a second address, the first address designating one of said N read buses and said N write buses, and the second address designating a first position of a first slot from among the first slots included in each of said N read busses and said N write buses,
said read data processing unit is configured to (i) select a piece of data read via a first slot at a first position designated by a second address, from among pieces of data read via the first slots included in the one of said N read buses designated by the first address, and (ii) provide the selected piece of data read via a first slot at a first position designated by a second address to a second slot at a second position designated by a particular second slot address, the particular second slot address associated with a first slot address including a first address and a second address used in a selection, and
said write data processing unit is configured to provide a piece of data provided via a second slot at a second position designated by a second slot address, to a particular first slot at a first position designated by a second address included in a first slot address associated with a second slot address, the particular first slot being included in one of the N write buses designated by a first address included in a first slot address.

4. The memory device according to claim 3,
wherein said write data processing unit is configured to (i) provide a piece of data provided via a second slot at a second position designated by a second slot address, to the first slot in each of said N write buses, the first slot being located at a first position designated by a second address included in a first slot address associated with a second slot address, and (ii) assign, for each of said N write buses which is designated by a first address, a first slot with a flag, the first slot with a flag not being provided with any piece of data via any one of the second slots, and the flag being used for instructing not to write any piece of data to any one of said N memory modules via the first slot assigned with the flag.

5. The memory device according to claim 2, further comprising
a command interface which (i) receives a plurality of commands in one cycle of a signal based on a synchronizing signal supplied from outside, and (ii) converts the received plurality of commands to generate (a) N addresses of said N memory modules and (b) the slot address,
wherein said address holding unit is configured to hold the N addresses generated by said command interface, and
said slot address processing unit is configured to obtain the slot address generated by said command interface.

6. The memory device according to claim 5,
wherein said command interface receives N commands that are the plurality of commands in one cycle of the signal based on the synchronizing signal.

7. The memory device according to claim 2, further comprising:
a plurality of group memory modules each including said N memory modules, said N read buses, said N write buses, said address holding unit, said read data processing unit, said write data processing unit, said output data bus, said input data bus, and said slot address processing unit; and
a command interface which converts a command supplied from outside to generate (a) addresses of said plurality of group memory modules and (b) the slot address,
wherein said address holding unit in each of said plurality of group memory modules is configured to hold a corresponding one of the addresses generated by said command interface, and
said slot address processing unit in each of said plurality of group memory modules is configured to obtain the slot address generated by said command interface.

8. The memory device according to claim 7,
wherein said command interface receives a plurality of commands in one cycle of a signal based on a synchronizing signal supplied from outside.

9. The memory device according to claim 8,
wherein said command interface receives the plurality of commands corresponding to a number of said plurality of group memories, in one cycle of the signal based on the synchronizing signal.

10. The memory device according to claim 7, further comprising
a data input-output interface which (i-1) converts Write data to correspond to the first size, the Write data being supplied from an external data bus and corresponding to a bus width of the external data bus and (i-2) provides the converted Write data to said input data bus in each of said plurality of group memory modules, and which (ii-1) converts Read data to corresponding to the bus width of the external data bus, the Read data corresponding to the first size of said output data bus in each of said plurality of group memory modules and (ii-2) provides the converted Read data to the external data bus,
wherein said data input-output interface (i) receives, in one cycle of a signal based on a synchronizing signal supplied from outside, pieces of data each supplied from the external data bus and corresponding to the bus width of the external data bus, and (ii) provides, in one cycle of the signal based on the synchronizing signal supplied from outside, pieces of Read data including the Read data each converted to correspond to the bus width of the external data bus, to the external data bus.

11. The memory device according to claim 7, further comprising
a plurality of data input-output interfaces each corresponding to a corresponding one of said plurality of group memory modules, each of said plurality of data input-output interfaces (i-1) converting Write data to correspond to the first size, the Write data being supplied from an external data bus and corresponding to a bus width of the external data bus and (i-2) providing the converted Write data to said input data bus in each of said plurality of group memory modules, and (ii-1) converting Read data to corresponding to the bus width of the external data bus, the Read data corresponding to the first size of said output data bus in each of said plurality of group memory modules and (ii-2) providing the converted Read data to the external data bus,
wherein each of said plurality of data input-output interfaces (i) receives, in one cycle of a signal based on a synchronizing signal supplied from outside, pieces of data each supplied from the external data bus and corresponding to the bus width of the external data bus, and (ii) provides, in one cycle of the signal based on the synchronizing signal supplied from outside, pieces of Read data including the Read data each converted to correspond to the bus width of the external data bus, to the external data bus.

12. The memory device according to claim 1,
wherein said write data processing unit is configured to assign a first slot with a flag, the first slot with a flag not being provided with any piece of data via any one of the second slots, and the flag being used for instructing not to write any piece of data to any one of said N memory modules via the first slot assigned with the flag.

13. The memory device according to claim 1,
wherein the first size is equal to the second size.

14. The memory device according to claim 13,
wherein each of said N read buses and said N write buses includes N first slots that are the first slots, and
each of said output data bus and said input data bus includes N second slots that are the second slots.

15. The memory device according to claim 1, further comprising
a data input-output interface which (i-1) converts Write data to correspond to the first size, the Write data being supplied from an external data bus and corresponding to a bus width of the external data bus and (i-2) provides the converted Write data to said input data bus, and which (ii-1) converts Read data to correspond to the bus width of the external data bus, the Read data corresponding to the first size of the bus width of said output data bus and (ii-2) provides the converted Read data to the external data bus, wherein said data input-output interface (i) receives, in one cycle of a signal based on a synchronizing signal supplied from outside, pieces of data each supplied from the external data bus and corresponding to the bus width of the external data bus, and (ii) provides, in one cycle of the signal based on the synchronizing signal supplied from outside, pieces of Read data including the Read data each converted to correspond to the bus width of the external data bus, to the external data bus.

16. A control method of controlling a memory device from and to which data corresponding to a first size can be read and written, the memory device including:
- an address holding unit configured to hold N addresses where N is an integer of 2 or more;
- N read buses and N write buses, each of said N read buses and said N write buses having a bus width of a second size and including first slots, each of the first slots being a partial bus having a bus width of a third size;
- N memory modules each uniquely connected to a corresponding one of the N read buses and a corresponding one of the N write buses, each of the N memory modules holding data for each address designated by a corresponding one of the N addresses held in the address holding unit; and
- an output data bus and an input data bus each having a bus width of the first size and including second slots, each of the second slots being a partial bus having a bus width of the third size, said control method comprising:
(i) selecting, from among pieces of data read from the N memory modules via the N read buses, pieces of data read via two or more first slots from among the first slots included in the N read buses, and (ii) providing the selected pieces of data to second slots from among the second slots included in the output data bus; and providing each of pieces of data provided via the second slots included in the input data bus, to a corresponding one of the first slots included in the N write buses, so as to write the pieces of data provided via the second slots included in said input data bus to the N memory modules.

* * * * *